US012672231B2

(12) United States Patent
Byun et al.

(10) Patent No.: US 12,672,231 B2
(45) **Date of Patent: *Jun. 30, 2026**

(54) PRINTED CIRCUIT BOARD AND SUBSTRATE INCLUDING ELECTRONIC COMPONENT EMBEDDED THEREIN

(71) Applicant: SAMSUNG ELECTRO-MECHANICS CO., LTD., Suwon-si (KR)

(72) Inventors: Dae Jung Byun, Suwon-si (KR); Mi Sun Hwang, Suwon-si (KR); Jung Soo Kim, Suwon-si (KR); Jin Won Lee, Suwon-si (KR); Duck Young Maeng, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/217,791

(22) Filed: Jul. 3, 2023

(65) Prior Publication Data

US 2023/0354513 A1 Nov. 2, 2023

Related U.S. Application Data

(63) Continuation of application No. 17/198,754, filed on Mar. 11, 2021, now Pat. No. 11,744,012.

(30) Foreign Application Priority Data

Sep. 9, 2020 (KR) ........................ 10-2020-0115386

(51) Int. Cl.
*H05K 1/02* (2006.01)
*H05K 1/03* (2006.01)
(Continued)

(52) U.S. Cl.
CPC ........... *H05K 1/0298* (2013.01); *H05K 1/036* (2013.01); *H05K 1/115* (2013.01); *H05K 1/185* (2013.01);
(Continued)

(58) Field of Classification Search
CPC ...... H05K 1/0298; H05K 1/036; H05K 1/115; H05K 1/185; H05K 1/0366; H05K 1/111;
(Continued)

(56) References Cited

U.S. PATENT DOCUMENTS 6,324,067 B1 * 11/2001 Nishiyama ............. H05K 1/183
428/209
7,894,203 B2 * 2/2011 Kariya .............. H01L 23/49838
361/795
(Continued)

FOREIGN PATENT DOCUMENTS

CN 104749885 A 7/2015
CN 111148347 A 5/2020
(Continued)

OTHER PUBLICATIONS

Notice of Allowance issued in corresponding U.S. Appl. No. 17/198,754 dated Apr. 24, 2023.
(Continued)

*Primary Examiner* — Ishwarbhai B Patel
(74) *Attorney, Agent, or Firm* — MORGAN, LEWIS & BOCKIUS LLP

(57) ABSTRACT

A printed circuit board includes a first insulating layer having a first modulus; a second insulating layer disposed on the first insulating layer and having a second modulus; and a cavity penetrating the second insulating layer, wherein the second modulus is greater than the first modulus, and wherein an edge portion of a bottom surface of the cavity is formed of an insulating material.

13 Claims, 23 Drawing Sheets

500F1

(51) Int. Cl.

| | |
|---|---|
| *H05K 1/11* | (2006.01) |
| *H05K 1/18* | (2006.01) |
| *H05K 1/185* | (2026.01) |

(52) U.S. Cl.
CPC ......... *H05K 1/0296* (2013.01); *H05K 1/0366* (2013.01); *H05K 1/111* (2013.01); *H05K 1/18* (2013.01); *H05K 2201/0141* (2013.01)

(58) Field of Classification Search
CPC . H05K 2201/0141; H05K 2201/10159; H05K 1/02; H05K 1/0296; H05K 3/4644; H05K 3/4697; H05K 2203/025
See application file for complete search history.

(56) References Cited

U.S. PATENT DOCUMENTS

| | | | | |
|---|---|---|---|---|
| 8,084,120 | B2 | 12/2011 | Hill | |
| 8,519,041 | B2 | 8/2013 | Smith | |
| 8,872,041 | B2 * | 10/2014 | Lee | H05K 3/462 |
| | | | | 174/250 |
| 9,699,909 | B2 | 7/2017 | Ishiguro | |
| 11,744,012 | B2 * | 8/2023 | Byun | H05K 1/185 |
| | | | | 174/251 |
| 2008/0049405 | A1 | 2/2008 | Sahara | |
| 2009/0175017 | A1 * | 7/2009 | Kita | H01L 21/4857 |
| | | | | 361/792 |
| 2015/0366061 | A1 * | 12/2015 | Noda | H01L 23/49838 |
| | | | | 361/803 |
| 2015/0366062 | A1 * | 12/2015 | Noda | H01L 23/49827 |
| | | | | 361/803 |
| 2016/0113110 | A1 * | 4/2016 | Furusawa | H05K 1/0271 |
| | | | | 174/251 |
| 2016/0120033 | A1 | 4/2016 | Furusawa | |
| 2016/0174381 | A1 | 6/2016 | Lee | |
| 2017/0064835 | A1 * | 3/2017 | Ishihara | H05K 3/4697 |
| 2018/0033732 | A1 * | 2/2018 | Sakamoto | H01L 21/486 |
| 2019/0215958 | A1 * | 7/2019 | Ishihara | H05K 1/114 |
| 2020/0144234 | A1 | 5/2020 | Jeon et al. | |
| 2020/0152566 | A1 | 5/2020 | Oh | |

FOREIGN PATENT DOCUMENTS

| | | |
|---|---|---|
| JP | 2015-028963 A | 2/2015 |
| KR | 10-2017-0092285 A | 8/2017 |

OTHER PUBLICATIONS

Final Office Action issued in corresponding U.S. Appl. No. 17/198,754 dated Dec. 27, 2022.

Office Action issued in corresponding U.S. Appl. No. 17/198,754 dated Jul. 22, 2022.

Office Action issued in corresponding Chinese Patent Application No. 202110725703.0 dated Dec. 2, 2025, with English translation.

\* cited by examiner

500D2

100F

PRINTED CIRCUIT BOARD AND SUBSTRATE INCLUDING ELECTRONIC COMPONENT EMBEDDED THEREIN

CROSS-REFERENCE TO RELATED APPLICATION(S)

This is the continuation application of U.S. patent application Ser. No. 17/198,754 filed on Mar. 11, 2021 (now U.S. Pat. No. 11,744,012, issued Aug. 29, 2023), which claims the benefit of priority to Korean Patent Application No. 10-2020-0115386 filed on Sep. 9, 2020, in the Korean Intellectual Property Office, the disclosures of which are incorporated herein by reference in their entirety.

TECHNICAL FIELD

The present disclosure relates to a printed circuit board and a substrate including an electronic component embedded therein.

BACKGROUND

As electronic devices in the information technology (IT) field, including mobile phones, have been designed to have reduced and simplified sizes, a technique for inserting an electronic component such as an integrated circuit (IC) into a printed circuit board has been necessary to meet the technical demand as above, and the techniques for embedding an electronic component in a printed circuit board in various manners have been developed. Accordingly, various cavity structures may be formed on a printed circuit board.

SUMMARY

An aspect of the present disclosure is to provide a printed circuit board which may implement a cavity by a blasting process without a stopper, and a substrate including an electronic component embedded therein including the same.

According to an aspect of the present disclosure, by disposing an insulating layer having a relatively high modulus on an insulating layer having a relatively low modulus and by forming a cavity penetrating the insulating layer having a relatively high modulus by a blasting process using the insulating layer having a relatively low modulus as a barrier layer, a printed circuit board having a cavity and a substrate including an electronic component embedded therein including the same may be provided.

For example, according to an aspect of the present disclosure, a printed circuit board may include a first insulating layer having a first modulus; a second insulating layer disposed on the first insulating layer and having a second modulus; and a cavity penetrating the second insulating layer, wherein the second modulus is greater than the first modulus, and wherein an edge portion of a bottom surface of the cavity is formed of an insulating material.

For example, according to an aspect of the present disclosure, a printed circuit board may include a core structure including a first insulating body and a plurality of core wiring layers disposed on or in the first insulating body, and having a cavity; an electronic component disposed in the cavity; and a built-up structure including a second insulating body covering at least a portion of each of the core structure and the electronic component and filling at least a portion of the cavity, and one or more built-up wiring layers disposed on or in the second insulating body, wherein the first insulating body includes a first insulating layer having a first modulus and a second insulating layer disposed on the first insulating layer and having a second modulus greater than the first modulus, wherein the cavity penetrates the second insulating layer, and wherein an edge portion of a bottom of the cavity is formed of an insulating material.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
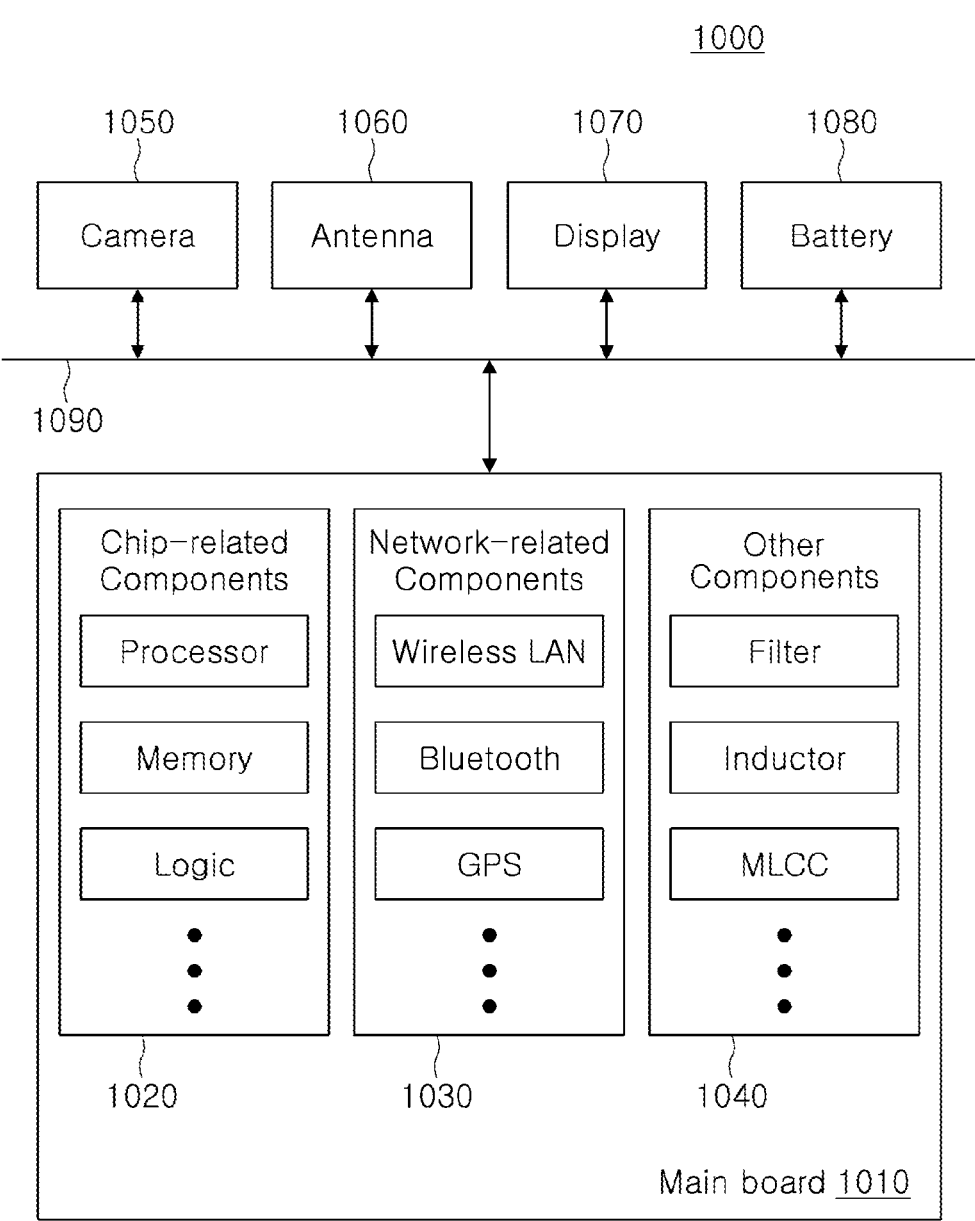
FIG. 1 is a block diagram illustrating an example of an electronic device system.

Hereinafter, example embodiments of the present disclosure will be described with reference to the accompanying drawings. In the drawings, shapes, sizes, and the like, of elements may be exaggerated or briefly illustrated for clarity of description.

FIG. 1 is a block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other. The chip related components 1020 may have a package form including the above-described chip.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
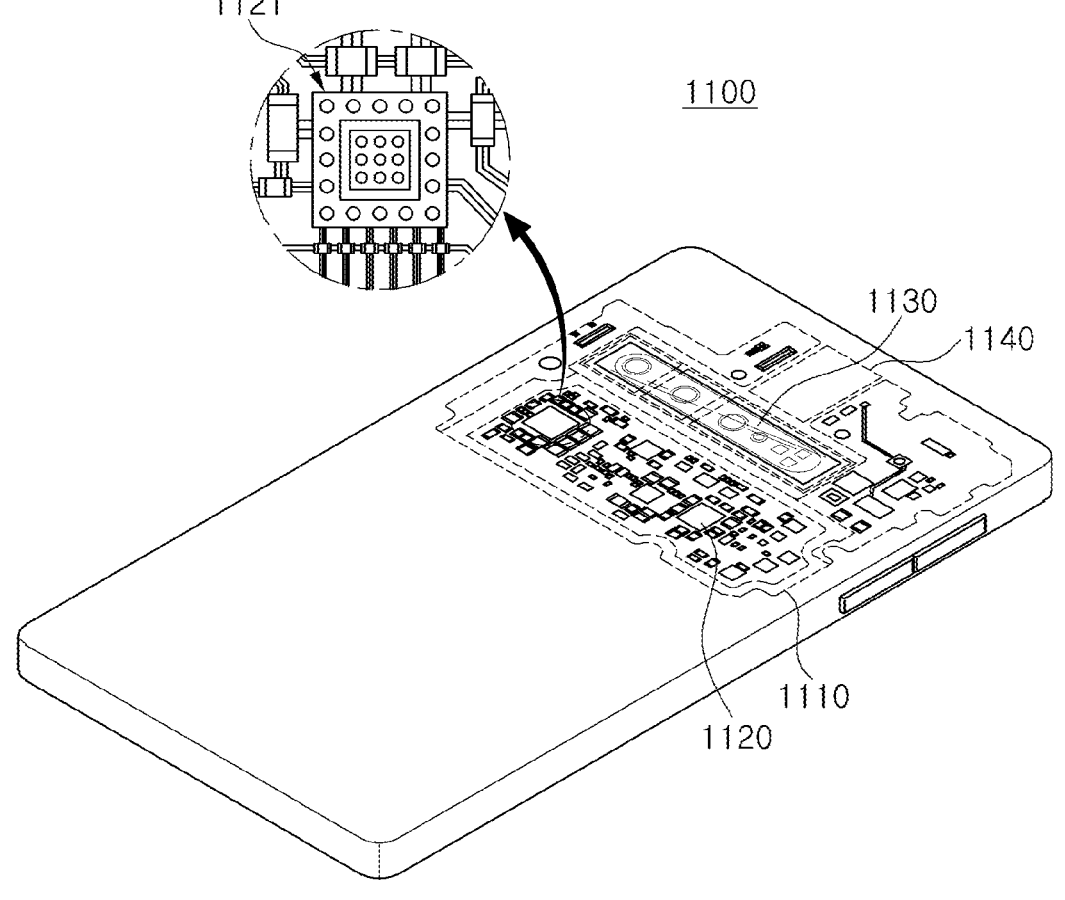
FIG. 2 is a perspective diagram illustrating an example of an electronic device.

FIG. 2 is a perspective diagram illustrating an example of an electronic device.

Referring to FIG. 2, the electronic device may be implemented by a smartphone 1100. A motherboard 1110 may be accommodated in a smartphone 1100, and various electronic components 1120 may be physically or electrically connected to the motherboard 1110. The camera module 1130 and/or the speaker 1140 may be accommodated therein. Some of the components 1120 may be the chip related components, such as a component package 1121, for example, but an example embodiment thereof is not limited thereto. In the component package 1121, a plurality of electronic components may be disposed on a multilayer printed circuit board in the form of surface mounting, but an example embodiment thereof is not limited thereto. The electronic device is not necessarily limited to the smartphone 1100, but may be other electronic devices as described above.

Figure 3:
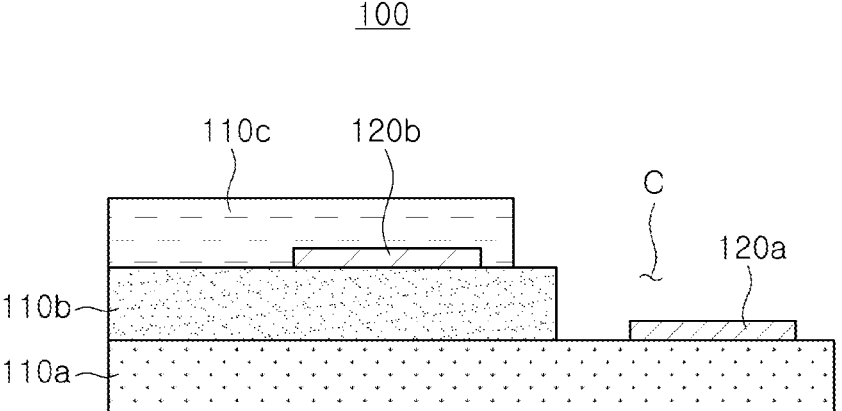
FIG. 3 is a cross-sectional diagram illustrating an example of a printed circuit board.

FIG. 3 is a cross-sectional diagram illustrating an example of a printed circuit board.

Figure 4:
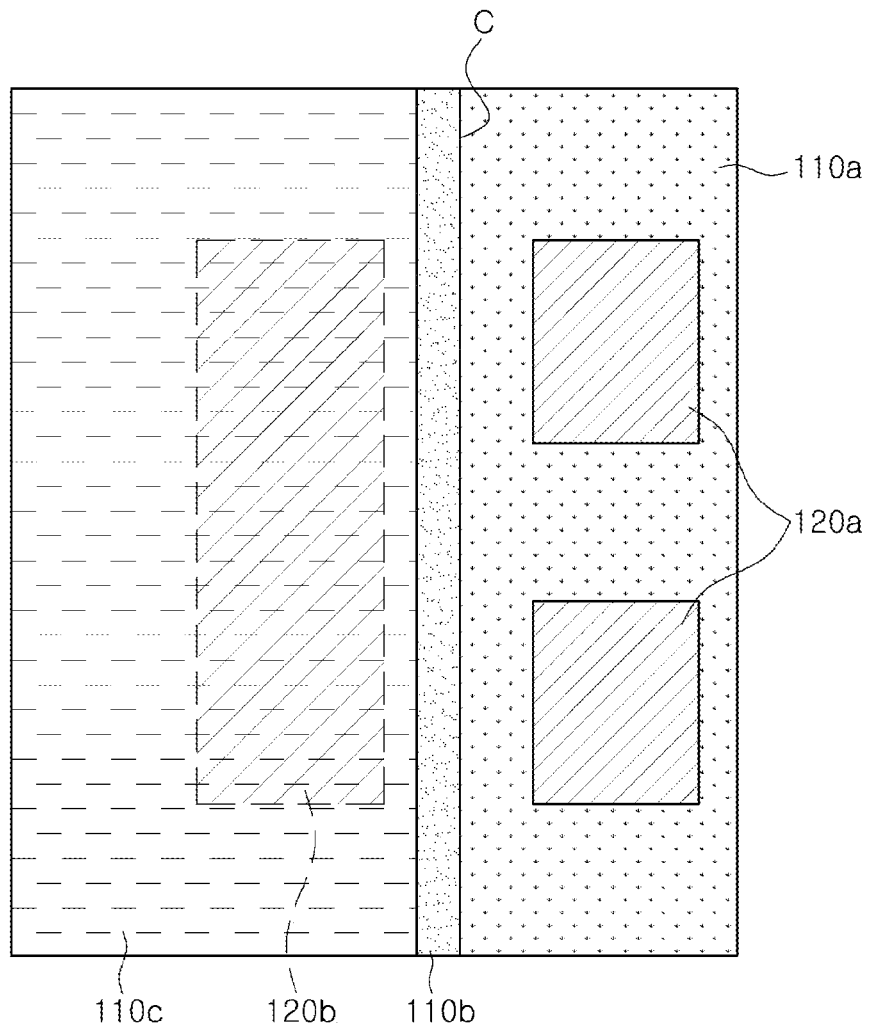
FIG. 4 is a plan diagram illustrating the printed circuit board illustrated in FIG. 3, viewed from above.

FIG. 4 is a plan diagram illustrating the printed circuit board illustrated in FIG. 3, viewed from above.

Referring to the diagram, a printed circuit board 100 in the example embodiment may include a first insulating layer 110a having a first modulus of elasticity (also referred to herein as the "first modulus"), a second insulating layer 110b disposed on the first insulating layer 110a and having a second modulus of elasticity (also referred to herein as the "second modulus"), and a cavity C penetrating the second insulating layer 110b. If necessary, the printed circuit board 100 may further include a first wiring layer 120a disposed on the first insulating layer 110a and exposed through the cavity C, a second wiring layer 120b disposed on the second insulating layer 110b, and/or a passivation layer 110c disposed on the second insulating layer 110b and covering the second wiring layer 120b. Each of the first insulating layer 110a and the second insulating layer 110b may include a plurality of insulating layers. For example, the first insulating layer 110a may include a plurality of insulating layers each having a first modulus. Also, the second insulating layer 110b may include a plurality of insulating layers each having a second modulus.

Recently, a technique of embedding electronic in a printed circuit board in various ways has been developed, and accordingly, various cavity structures may be formed in the printed circuit board. For example, to correspond to a highly integrated substrate requiring a fine pitch, forming a cavity structure using a blasting process has been considered. To process the cavity through blasting, it may be necessary to form a pattern layer which may generally work as a stopper. However, when the pattern layer is formed as above, a process of forming the pattern layer may be added such that costs may increase due to the additional process. Further, when the cavity is formed, the issue of misalignment with the pattern layer may occur. To reduce misalignment, it may be necessary to secure a sufficient space in consideration of the issue, but in this case, it may be difficult to reduce a size.

In the printed circuit board 100 in the example embodiment, the first insulating layer 110*a* having a relatively low modulus may be used as a barrier layer for processing the cavity C using a blasting process. For example, in the blasting process, the second insulating layer 110*b* having a relatively high modulus of elasticity may be processed, while the first insulating layer 110*a* having a relatively low modulus of elasticity may function as a barrier layer. Accordingly, when the first insulating layer 110*a* is used as a barrier layer for processing the cavity C, a pattern layer for a stopper for processing the cavity C may not be necessary. Thus, it may be possible to reduce the number of process steps, alignment issues may be avoided, and a size may be reduced. In this case, an edge portion of the bottom surface of the cavity C may be formed of an insulating material, that is, a boundary between the first insulating layer 110*a* and the second insulating layer 110*b*, for example.

Specifically, as for the process for forming the cavity C, a technique such as a blasting process in which an abrasive is sprayed with pneumatic pressure and is mechanically processed may be used, and the etching amount may vary according to a modulus of elasticity (also referred to herein as "the modulus"), a mechanical property of an object to be processed. For example, the smaller the modulus, the smaller the amount of etching. Accordingly, when the first insulating layer 110*a* has a modulus lower than that of the second insulating layer 110*b*, the first insulating layer 110*a* may be effectively used as a barrier layer for processing the cavity C. The modulus refers to a ratio of stress and strain. For example, to obtain a modulus, a stress-strain curve until fracture occurs at room temperature may be obtained using a universal testing machine (UTM), and a slope of weight in the stress-strain curve for initial deformation may be expressed in gigapascals (GPa), but an example embodiment thereof is not limited thereto.

For example, as in [Table 1] below, material 1 which may be implemented by liquid crystal polymer (LCP) and may be used as a material of the first insulating layer 110*a* may have a relatively low modulus, 5 GPa or less. Accordingly, the amount of etching by microblasting (uBlast) may be relatively small, about 1 μm. Material 2 which may be implemented with prepreg (PPG) and may be used as a material of the second insulating layer 110*b* may have a relatively high modulus, 20 GPa or higher. Therefore, the amount of etching by microblasting may be relatively large, about 30 μm. Accordingly, the modulus of material 2 may be approximately 4 times the modulus of material 1 or greater, and accordingly, the amount of etching of material 2 may be approximately 20 times the amount of etching of material 1 or greater. In other words, the etch rate of the material of the second insulating layer for a microblasting process is greater than that of the material of the first insulating layer. Therefore, when the cavity C penetrating the second insulating layer 110*b* is formed by a blasting process, the first insulating layer 110*a* may be effectively used as a barrier layer.

TABLE 1

| Classification | Modulus [GPa] | Amount of Etching [μm] |
| --- | --- | --- |
| Material 1 | 3.1 | 1.1 |
| Material 2 | 22-26, 30-33 | 29.6 |

The material of the first insulating layer 110*a* may not be limited to LCP, and materials such as polyimide (PI), an Ajinomoto built-up film (ABF), or the like, having a relatively low modulus, may be used. Also, a material of the second insulating layer 110*b* may not be limited to PPG, and an insulating material of a copper clad laminate (CCL), a material having a relatively high modulus, may be used. Accordingly, as the material of the first insulating layer 110*a*, a material including an insulating resin without glass fibers, or a material including an insulating resin and inorganic filler without glass fibers may be used. Also, as a material of the second insulating layer 110*b*, a material including an insulating resin and an inorganic filler together with glass fibers may be used.

Each of the first wiring layer 120*a* and the second wiring layer 120*b* may perform various functions according to a design. For example, each of the first wiring layer 120*a* and the second wiring layer 120*b* may include a ground pattern, a power pattern, a signal pattern, and the like. Here, the signal pattern may include various signals other than the ground pattern and the power pattern, such as a data signal, for example. Each of these patterns may have a shape of line, a shape of plane, or a pad shape. Each of the first wiring layer 120*a* and the second wiring layer 120*b* may be formed by a plating process such as an additive process (AP), a semi-AP (SAP) process, a modified SAP (MSAP) process, a tenting (TT) process, or the like, and may thus include a seed layer, an electroless plating layer, and an electrolytic plating layer formed on the basis of the seed layer. A metal material may be used as the material of the first wiring layer 120*a* and the second wiring layer 120*b*, and as the metal material, copper (Cu), aluminum (Al), silver (Ag), tin (Sn), gold (Au), nickel (Ni), lead (Pb), titanium (Ti), or an alloy thereof may be used.

The passivation layer 120*c* may protect the second wiring layer 120*b* from external physical and chemical damage. As a material of the passivation layer 120*c*, an insulating material may be used, and as the insulating material, a thermosetting resin such as an epoxy resin, a thermoplastic resin such as polyimide, or a material in which these resins are mixed with an inorganic filler such as silica, such as an ABF, for example, may be used, but an example embodiment thereof is not limited thereto.

Figure 5:
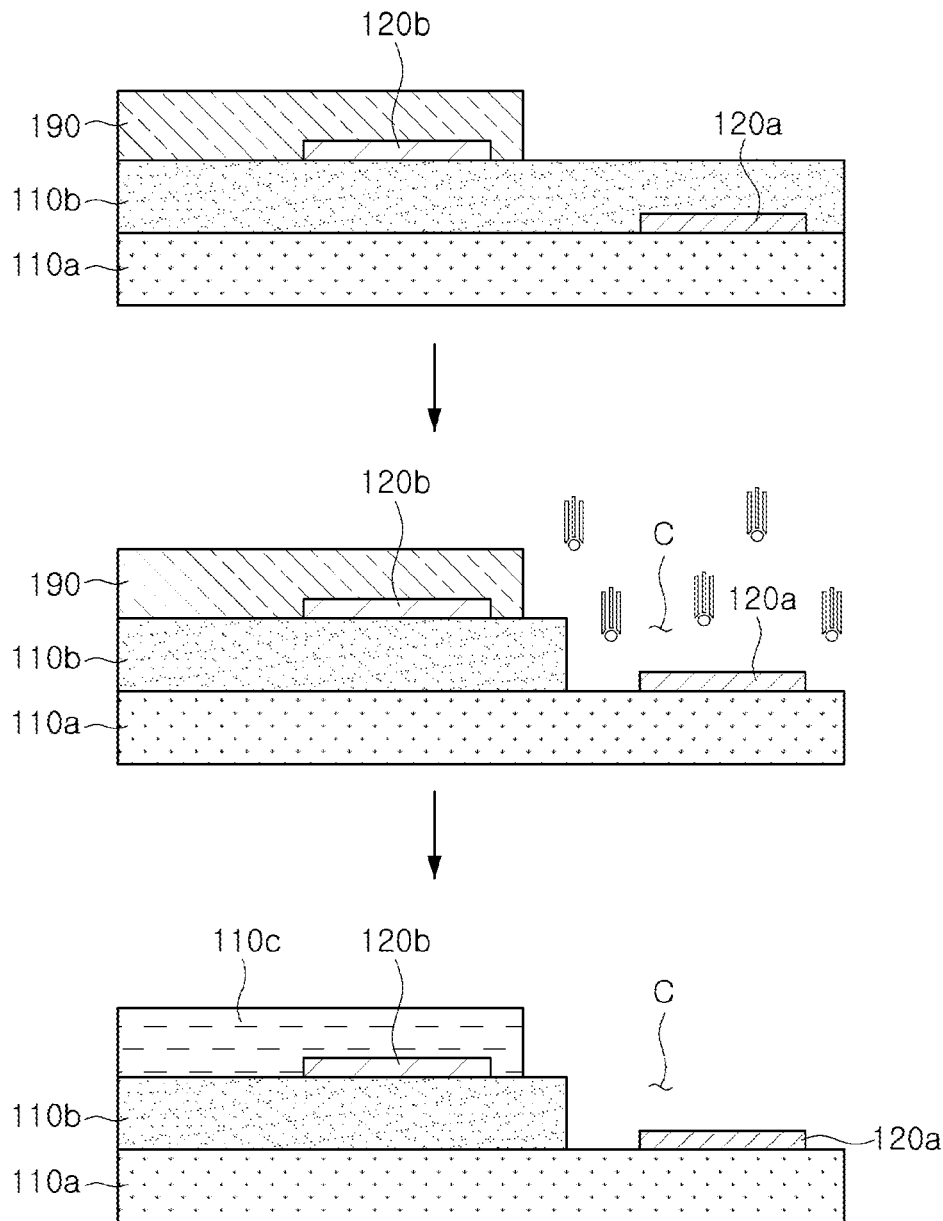
FIG. 5 is a diagram illustrating processes for manufacturing the printed circuit board illustrated in FIG. 3.

FIG. 5 is a diagram illustrating processes for manufacturing the printed circuit board illustrated in FIG. 3.

Referring to the diagram, first, a patterned dry film 190 may be disposed on a second insulating layer 110*b* such that a position in which a cavity is formed may be exposed. Thereafter, the cavity C penetrating the second insulating layer 110*b* may be processed using a microblasting process. In this case, the first insulating layer 110*a* may be used as a barrier layer as described above. The dry film 190 may be removed, and if necessary, a passivation layer 120*c* may be further formed. The printed circuit board 1000 in the example embodiment described above may be manufactured through a series of processes, and as the descriptions of the other configurations may be the same as above, the detailed descriptions thereof will not be repeated.

Figure 6:
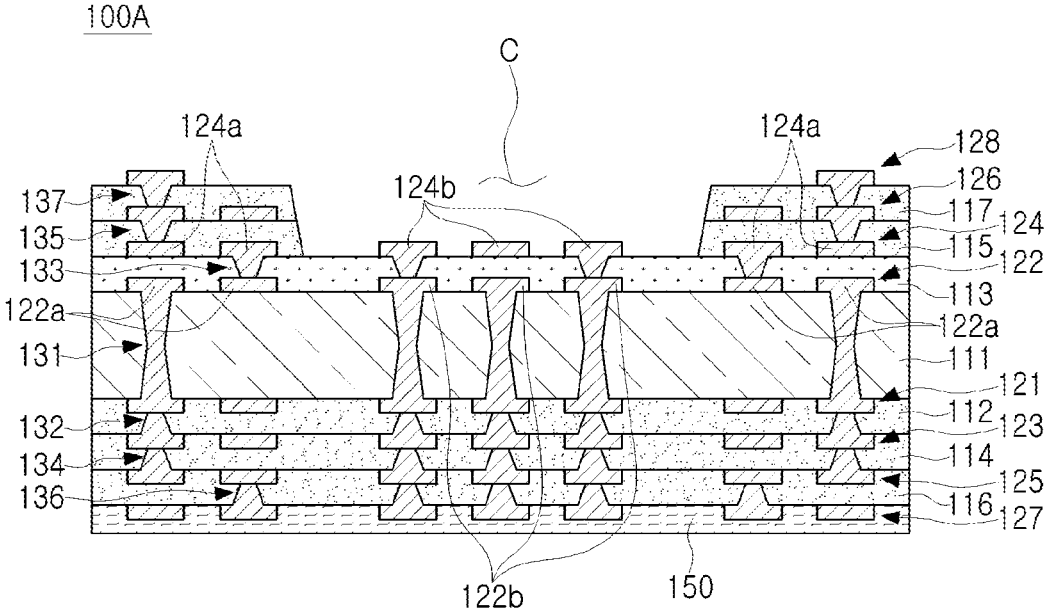
FIG. 6 is a cross-sectional diagram illustrating another example of a printed circuit board.

FIG. 6 is a cross-sectional diagram illustrating another example of a printed circuit board.

Referring to FIG. 6, a printed circuit board 100A in the example embodiment may include a plurality of insulating layers 111, 112, 113, 114, 115, 116, and 117, a plurality of wiring layers 121, 122, 123, 124, 125, 126, 127, and 128, and a plurality of wiring via layers 131, 132, 133, 134, 135, 136, and 137, and may further include a passivation layer 150 if necessary. Also, the printed circuit board 100A may have a cavity C penetrating the fifth and seventh insulating layers 115 and 117 disposed above the third insulating layer 113. Accordingly, the third insulating layer 113 may work as a barrier layer for a blasting process for forming the cavity C. In this sense, the third insulating layer 113 may have a modulus lower than those of the fifth and seventh insulating layers 115 and 117 in which the cavity C is formed.

The cavity (C) may expose at least a portion of the upper surface of the third insulating layer 113. The cavity C may have a tapered shape in which a width decreases downwardly on a cross sectional surface, and may have a ring shape such as a square ring on a plane. The exposed upper surface of the third insulating layer 113 may be provided as a bottom surface of the cavity C. An edge portion of the bottom surface of the cavity C may be formed by a boundary between the third insulating layer 113 and the fifth insulating layer 115. The fourth wiring layer 124 may include a first wiring pattern 124a disposed on the upper surface of the third insulating layer 113 and having at least a portion buried in the fifth insulating layer 115, and a second wiring pattern 124b disposed on the upper surface and having at least a portion exposed by the cavity C. At least a portion of the fourth wiring layer 124 may be connected to at least a portion of the sixth wiring layer 126 disposed on the fifth insulating layer 115 through the fifth wiring via layer 135 penetrating the fifth insulating layer 115.

In the description below, each of the elements included in the printed circuit board 100A according to an example embodiment will be described in greater detail with reference to the drawings.

The plurality of insulating layers 111, 112, 113, 114, 115, 116, and 117 may include the first insulating layer 111, the second and third insulating layers 112 and 113 disposed on both sides of the first insulating layer 111, the fourth and fifth insulating layers 114 and 115 disposed on the second and third insulating layers 112 and 113, respectively, and the sixth and seventh insulating layers 116 and 117 disposed on the fourth and fifth insulating layers 114 and 115, respectively. Accordingly, each of the plurality of insulating layers 111, 112, 113, 114, 115, 116, and 117 may be core-type insulating layers. The plurality of insulating layers 111, 112, 113, 114, 115, 116, and 117 may include a smaller number of insulating layers, or may include a greater number of insulating layers.

An insulating material may be used as a material of the plurality of insulating layers 111, 112, 113, 114, 115, 116, and 117, and as the insulating material, a thermosetting resin such as epoxy resin or a thermoplastic resin such as polyimide, and the above-mentioned resin including inorganic fillers such as silica and/or reinforcing materials such as glass fibers may be used. Alternatively, LCP or the like, may be used as a material for a specific insulating layer. For example, as a material of the first insulating layer 111, an insulating material of a copper clad laminate may be used. Also, PPG may be used as a material for the second and fourth to seventh insulating layers 112, 114, 115, 116, and 117. Also, as a material of the third insulating layer 113, ABF, LCP, PI, or the like, may be used. The first insulating layer 111 may have a thickness greater than those of the second to seventh insulating layers 112, 113, 114, 115, 116 and 117.

The plurality of wiring layers 121, 122, 123, 124, 125, 126, and 127 may include the first and second wiring layers 121 and 122 disposed on both sides of the first insulating layer 111, the third and fourth wiring layers 123 and 124 disposed on the second and third insulating layers 112 and 113 and buried in the fourth and fifth insulating layers 114 and 115, respectively, the fifth and sixth wiring layers 125 and 126 disposed on the fourth and fifth insulating layers 114 and 115 and buried in the sixth and seventh insulating layers 116 and 117, respectively, and the seventh and eighth wiring layers 127 and 128 disposed on the sixth and seventh insulating layers 116 and 117, respectively. The plurality of wiring layers 121, 122, 123, 124, 125, 126, and 127 may include a smaller number of wiring layers, or may include a larger number of wiring layers.

A metal material may be used as a material for the plurality of wiring layers 121, 122, 123, 124, 125, 126, and 127, and as a metal material, copper (Cu), aluminum (Al), silver (Ag), Tin (Sn), gold (Au), nickel (Ni), lead (Pb), titanium (Ti), or an alloy thereof may be used. Each of the plurality of wiring layers 121, 122, 123, 124, 125, 126, and 127 may perform various functions according to a design. For example, the plurality of wiring layers 121, 122, 123, 124, 125, 126, and 127 may include a ground pattern, a power pattern, a signal pattern, and the like. Here, the signal pattern may include various signals other than the ground pattern and the power pattern, such as a data signal, for example. Each of these patterns may have a shape of line, a shape of plane, or a pad shape. The plurality of wiring layers 121, 122, 123, 124, 125, 126, and 127 may be formed by a plating process such as AP, SAP, MSAP, or TT, and may thus include a seed layer, an electroless plating layer, and an electrolytic plating layer formed on the basis of the seed layer. A specific layer may further include a copper foil.

The plurality of wiring via layers 131, 132, 133, 134, 135, 136, and 137 may include a wiring via layer 131 penetrating the first insulating layer 111 and connecting the first and second wiring layers 121 and 122 to each other, a second wiring via layer 132 penetrating the second insulating layer 112 and connecting the first and third wiring layers 121 and 123 to each other, the third wiring via layer 133 penetrating the third insulating layer 113 and connecting the second and fourth wiring layers 122 and 124 to each other, a fourth wiring via layer 134 penetrating the fourth insulating layer 114 and connecting the third and fifth wiring layers 123 and 125 to each other, a fifth wiring via layer 135 penetrating the fifth insulating layer 115 and connecting the fourth and sixth wiring layers 124 and 126 to each other, a sixth wiring via layer 136 penetrating the sixth insulating layer 116 and connecting the fifth and seventh wiring layers 125 and 127 to each other, and an eighth wiring via layer 137 penetrating the seventh insulating layer 117 and connecting the sixth and eighth wiring layers 126 and 128 to each other. The plurality of wiring via layers 131, 132, 133, 134, 135, 136, and 137 may include a smaller number of wiring via layers, or may include a larger number of wiring via layers.

A metal material may be used as a material for the plurality of wiring via layers 131, 132, 133, 134, 135, 136, and 137, and as a metal material, copper (Cu), aluminum (Al), silver (Ag), tin (Sn), gold (Au), nickel (Ni), lead (Pb), titanium (Ti), or an alloy thereof may be used. Each of the plurality of wiring via layers 131, 132, 133, 134, 135, 136, and 137 may include a signal connection via, a ground connection via, a power connection via, and the like, according to a design. The wiring vias of the plurality of wiring via layers 131, 132, 133, 134, 135, 136, and 137 may be entirely filled with a metal material, or a metal material may be formed along a wall surface of the via hole. The first wiring via layer 131 may have an hourglass or cylindrical shape. Each of the second to seventh wiring via layers 132, 133, 134, 135, 136, and 137 may have a tapered shape. The second, fourth, and sixth wiring via layers 132, 134, and 136 and the third, fifth, and seventh wiring via layers 133, 135, and 137 may have tapered shapes formed to be tapering in opposite directions. The plurality of wiring via layers 131, 132, 133, 134, 135, 136, and 137 may be formed by a plating process, such as AP, SAP, MSAP, TT, or the like, for example, and may thus include an electroless plating layer, a seed layer, and an electroplating layer formed on the basis of the seed layer.

The passivation layer 150 may protect the lowermost seventh wiring layer 127 from external physical and chemical damage. The passivation layer 150 may be disposed on the lowermost sixth insulating layer 116 and may cover the lowermost seventh wiring layer 127. If necessary, an opening for exposing at least a portion of the lowermost seventh wiring layer 127 may be formed in the passivation layer 150. The material of the passivation layer 150 may be an insulating material. In this case, a thermosetting resin such as an epoxy resin, a thermoplastic resin such as polyimide, or a material in which these resins are mixed with an inorganic filler, such as ABF, for example, may be used, but an example embodiment thereof is not limited thereto.

As the descriptions of the other elements are the same as above, the detailed descriptions thereof will not be repeated.

Figure 7:
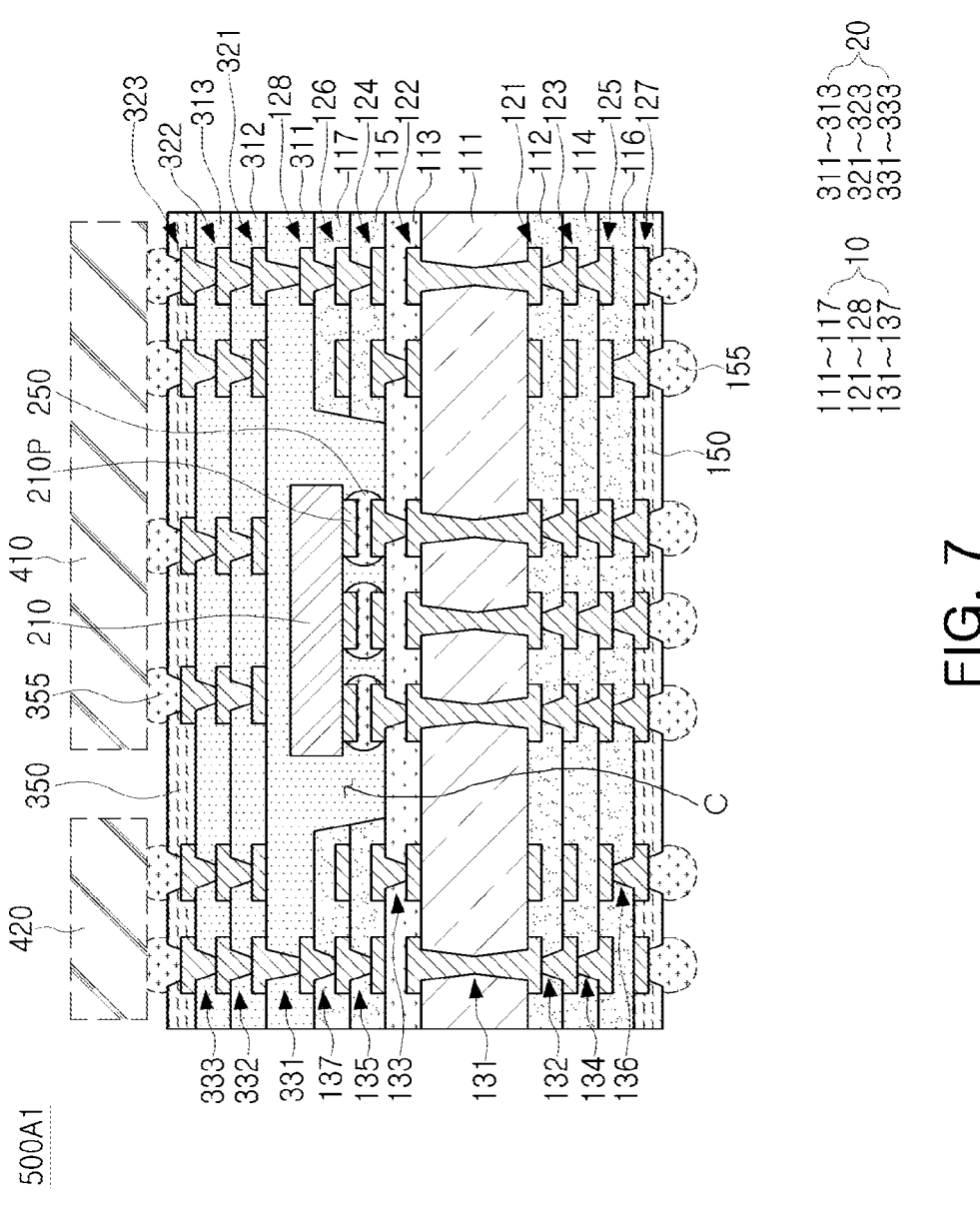
FIGS. 7 and 8 are cross-sectional diagrams illustrating an example and another example of a substrate including an electronic component embedded therein including the printed circuit board illustrated in FIG. 6, respectively.

FIG. 7 is a cross-sectional diagram illustrating an example of a substrate including an electronic component embedded therein including the printed circuit board illustrated in FIG. 6.

Referring to the diagram, a substrate including an electronic component embedded therein 500A1 in the example embodiment may include a core structure 10 having a cavity (C), a first electronic component 210 disposed in the cavity (C), and a built-up structure 20 disposed on the core structure 10 and the first electronic component 210. If necessary, the substrate 500A1 may further include at least one of a first passivation layer 150 disposed below the core structure 10, a second passivation layer 350 disposed above the built-up structure 20, a first electrical connection metal 155 disposed on the opening of the first passivation layer 150, a second electrical connection metal 355 disposed on the opening of the second passivation layer 350, and the second and third electronic components 410 and 420 surface-mounted on the built-up structure 20.

The core structure 10 may include a first insulating body including a plurality of core insulating layers 111, 112, 113, 114, 115, 116, and 117, a plurality of core wiring layers 121, 122, 123, 124, 125, 126, 127, and 128 disposed on or in the first insulating body, and a plurality of core wiring via layers 131, 132, 133, 134, 135, 136, and 137 penetrating a portion of the first insulating body and connected to the plurality of core wiring layers 121, 122, 123, 124, 125, 126, 127, and 128. The cavity C of the core structure 10 may penetrate the fifth and seventh core insulating layers 115 and 117 disposed above the third core insulating layer 113. Accordingly, the third core insulating layer 113 may work as a barrier layer for a blasting process for forming the cavity C. In this case, the third core insulating layer 113 may have a modulus lower than those of the fifth and seventh core insulating layers 115 and 117 in which the cavity C is formed.

The first electronic component 210 may be disposed in the cavity C. The first electronic component 210 may be configured as an IC in which hundreds to millions of devices are integrated into a single chip. For example, the first electronic component 120 may be implemented by a processor chip such as a central processor (e.g., CPU), a graphics processor (e.g., GPU), a field programmable gate array (FPGA), a digital signal processor, an encryption processor, a microprocessor, a microcontroller, and may be implemented by, for example, an application processor (AP), but an example embodiment thereof is not limited thereto, and may be implemented by a memory such as a volatile memory (e.g., DRAM), a non-volatile memory (e.g., ROM), a flash memory, or the like, or an analog-to-digital converter, or a logic such as an application-specific IC (ASIC). The first electronic component 210 may be disposed to be faced down such that a connection pad 210P may be electrically connected to at least a portion 123b of the third core wiring layer 123 exposed through the cavity C through a connection member 250 such as a solder adhesive. The first electronic component 210 may be configured as a chip-type passive component, such as a chip-type inductor or a chip-type capacitor, for example. The first electronic component 210 may be a combination of an IC and a passive component in the form of a chip, and in this case, a plurality of cavities C may be formed.

The built-up structure 20 may include a second insulating body covering at least a portion of each of the core structure 10 and the first electronic component 210, filling at least a portion of the cavity C, and including one or more built-up insulating layers 311, 312, and 313, one or more built-up wiring layers 321, 322, and 323 disposed on or in the second insulating body, and one or more built-up wiring via layers 331, 332, and 333 each penetrating a portion of the second insulating body and connected to the one or more built-up wiring layers 321, 322, and 323.

The second insulating body may include the one or more built-up insulating layers 311, 312, and 313, and the number of the built-up insulating layers 311, 312, and 313 may be greater or smaller than the example in the diagram. An insulating material may be used as the material of the second insulating body, and as the insulating material, a thermosetting resin such as epoxy resin, a thermoplastic resin such as polyimide, or a material in which these resins are mixed with an inorganic filler, such as ABF, for example, may be used, but an example embodiment thereof is not limited thereto. If necessary, a material further including a reinforcing material such as glass fiber, such as PPG, for example, may be used.

The number of the one or more built-up wiring layers 321, 322, and 323 may be greater or smaller than the example in the diagram. A metal material may be used as a material for the one or more built-up wiring layers 321, 322, 323, and as a metal material, copper (Cu), aluminum (Al), silver (Ag), tin (Sn), gold (Au), nickel (Ni), lead (Pb), titanium (Ti), or an alloy thereof may be used. Each of the one or more built-up wiring layers 321, 322, and 323 may perform various functions according to a design. For example, the one or more built-up wiring layers 321, 322, and 323 may include a ground pattern, a power pattern, a signal pattern, and the like. Each of these patterns may have a shape of line, a shape of plane, or a pad shape. The one or more built-up wiring layers 321, 322, and 323 may be formed by plating processes such as AP, SAP, MSAP, TT, or the like, and may thus include a seed layer, an electroless plating layer, and an electroplating layer formed based on the seed layer. The specific layer may further include copper foil.

The number of the one or more built-up wiring via layers 331, 332, and 333 may be greater or smaller than the example in the diagram, and a metal material may be used as a material for one or more built-up wiring via layers 331, 332, and 333, and as a metal material, copper (Cu), aluminum (Al), silver (Ag), tin (Sn), gold (Au), nickel (Ni), lead (Pb), titanium (Ti), or alloys thereof may be used. Each of the one or more built-up wiring via layers 331, 332, and 333 may include a signal connection via, a ground connection via, and a power connection via according to a design. Each of the wiring vias of the one or more built-up wiring via layers 331, 332, and 333 may be entirely filled with a metal material, or a metal material may be formed along the wall surface of the via hole. The one or more built-up wiring via layers 331, 332, and 333 may have a tapered shape. The one or more built-up wiring via layers 331, 332, 333 may be formed by a plating process, such as AP, SAP, MSAP, TT, or the like, for example, and may include a seed layer, an electroless plating layer, and an electrolytic plating layer formed on the basis of the seed layer.

Each of the first and second passivation layers 150 and 350 may protect the lowermost seventh core wiring layer 127 and the uppermost third built-up wiring layer 323 from external physical and chemical damage. The first and second passivation layers 150 and 350 may have openings for exposing at least a portion of the lowermost seventh core wiring layer 127 and at least a portion of the uppermost third built-up wiring layer 323. A plurality of the openings may be provided. An insulating material may be used for the material of the first and second passivation layers 150 and 350. In this case, a thermosetting resin such as an epoxy resin, a thermoplastic resin such as polyimide, or a mixture of these resins with an inorganic filler, such as ABF, may be used, but an example embodiment thereof is not limited thereto.

The first and second electrical connection metals 155 and 355 may be disposed on the openings of the first and second passivation layers 150 and 350, respectively. The first and second electrical connection metals 155 and 355 may be connected to at least an exposed portion of the lowermost seventh core wiring layer 127 and at least an exposed portion of the uppermost third buildup wiring layer 323. The first electrical connection metal 155 may physically and/or electrically connect the substrate 500A1 to an external entity. For example, the substrate 500A1 may be mounted on a main board of an electronic device or a ball grid array (BGA) substrate through the element. The second electrical connection metal 355 may physically and/or electrically connect the substrate 500A1 to the second and third electronic components 410 and 420 surface-mounted thereon. The first and second electrical connection metals 155 and 355 may be formed of tin (Sn) or an alloy including tin (Sn), such as solder, but an example embodiment thereof is not limited thereto. Each of the first and second electrical connection metals 155 and 355 may be configured as a land, a ball, a pin, or the like.

The second and third electronic components 410 and 420 may be configured as surface mounted components. The second and third electronic components 410 and 420 may be an active components and/or a passive component, respectively. An example of the active component may include the IC described in relation to the first electronic component 120. An example of a passive component may include a chip-type capacitor such as a multilayer ceramic capacitor (MLCC), and a chip-type inductor such as a power inductor (PI). If necessary, a molding material covering the second and third electronic components 410 and 420 may be further disposed on the second passivation layer 350, and the molding material may be a general epoxy molding compound (EMC), but an example embodiment thereof is limited thereto. When the second and third electronic components 410 and 420 are further disposed, the substrate 500A1 may be used as a system in package (SiP).

As the descriptions of the other elements are the same as above, detailed descriptions thereof will not be provided.

Figure 8:
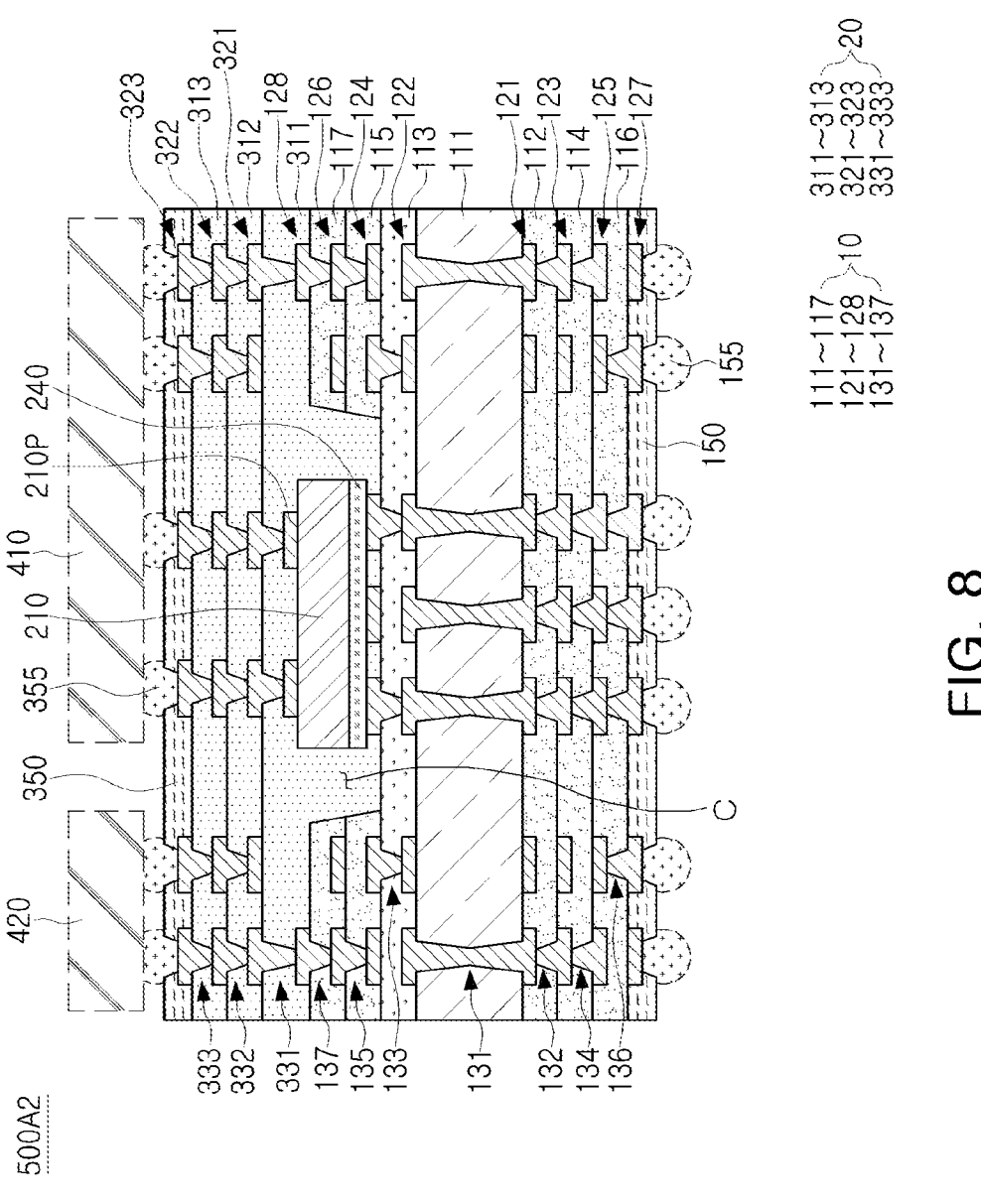

FIG. 8 is a cross-sectional diagram illustrating another example of a substrate including an electronic component embedded therein including the printed circuit board illustrated in FIG. 6.

Referring to the diagram, in a substrate including an electronic component embedded therein 500A2 in the example embodiment, the first electronic component 210 may be disposed to be face up in the cavity C as compared to the substrate 500A1 described in the aforementioned example embodiment. The first electronic component 210 may be attached to the bottom surface of the cavity C through an adhesive member 240 such as a die attach film (DAF). The connection pad 210P of the first electronic component 210 may be electrically connected to at least a portion of the first built-up wiring layer 321 through at least a portion of the first built-up wiring via layer 331. At least portions of first, second, third, fourth, fifth, and seventh core wiring layers 121, 122, 123, 124, 125, and 127 and of first, second, third, fifth, and seventh core wiring via layers 131, 132, 133, 135, and 137 may be disposed below the first electronic component 210 and may be used as a heat dissipation path for dissipating heat from the back surface of the first electronic component 210.

As the descriptions of the other elements are the same as described above, the detailed descriptions thereof will not be provided.

Figure 9:
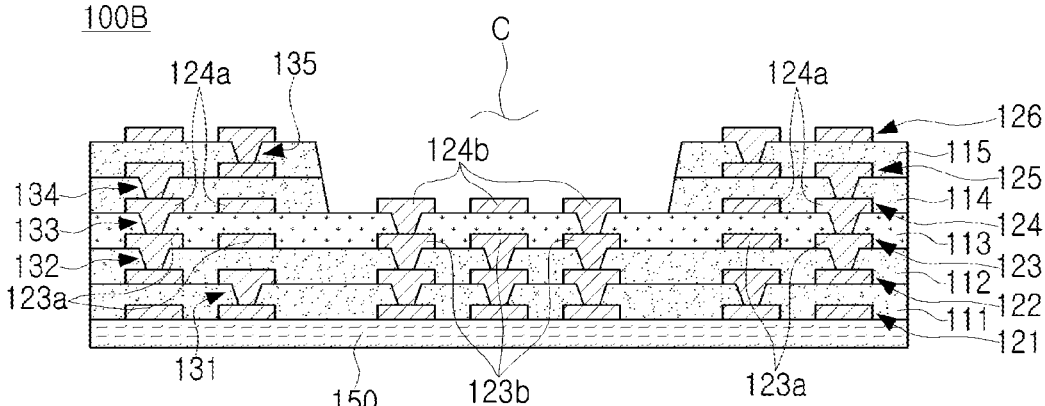
FIG. 9 is a cross-sectional diagram illustrating another example of a printed circuit board.

FIG. 9 is a cross-sectional diagram illustrating another example of a printed circuit board.

Referring to the diagram, a printed circuit board 100B in the example embodiment may include a plurality of insulating layers 111, 112, 113, 114, and 115, a plurality of wiring layers 121, 122, 123, 124, 125, and 126, and a plurality of wiring via layers 131, 132, 133, 134, and 135, and may further include a passivation layer 150 if necessary. Also, the printed circuit board 100B may further include a cavity C penetrating the fourth and fifth insulating layers 114 and 115 disposed above the third insulating layer 113. Accordingly, the third insulating layer 113 may work as a barrier layer for a blasting process for forming the cavity C. Accordingly, the third insulating layer 113 may have a modulus lower than those of the fourth and fifth insulating layers 114 and 115 in which the cavity C is formed.

The cavity (C) may expose at least a portion of the upper surface of the third insulating layer 113. The cavity C may have a tapered shape in which a width decreases downwardly on a cross sectional surface, and may have a ring shape such as a square ring on a plane. The exposed upper surface of the third insulating layer 113 may be provided as the bottom surface of the cavity C. An edge portion of the bottom surface of the cavity C may be formed by the boundary between the third insulating layer 113 and the fourth insulating layer 114. The fourth wiring layer 124 may include a first wiring pattern 124a disposed on the upper surface of the third insulating layer 113 and having at least a portion buried in the fourth insulating layer 114, and a second wiring pattern 124b disposed on the upper surface of the third insulating layer 113 and having at least portion exposed by the cavity C. At least a portion of the fourth wiring layer 124 may be connected to at least a portion of the fifth wiring layer 125 disposed on the fourth insulating layer 114 through the fourth wiring via layer 134 penetrating the fourth insulating layer 114.

In the description below, each of the elements included in the printed circuit board 100B according to an example will be described in greater detail with reference to the drawings.

The plurality of insulating layers 111, 112, 113, 114, and 115 may include the first insulating layer 111, the second insulating layer 112 disposed on the first insulating layer 111, and the third insulating layer 113 disposed on the second insulating layer 112, the fourth insulating layer 114 disposed on the third insulating layer 113, and the fifth insulating layer 115 disposed on the fourth insulating layer 114. Accordingly, the plurality of insulating layers 111, 112, 113, 114, and 115 may be of a coreless type. The plurality of insulating layers 111, 112, 113, 114, and 115 may include a smaller number of insulating layers or a larger number of insulating layers.

An insulating material may be used as a material of the plurality of insulating layers 111, 112, 113, 114, and 115, and as an insulating material, a thermosetting resin such as an epoxy resin or a thermoplastic resin such as polyimide, and the above-mentioned resin including inorganic fillers such as silica and/or reinforcing materials such as glass fibers may be used. Alternatively, LCP or the like, may be used as a material for a specific insulating layer. For example, PPG may be used as the material of the first, second, fourth, and fifth insulating layers 111, 112, 114, and 115. Also, as a material of the third insulating layer 113, ABF, LCP, PI, or the like, may be used. Thicknesses of the first to fifth insulating layers 111, 112, 113, 114, and 115 may be substantially the same, but an example embodiment thereof is not limited thereto.

The plurality of wiring layers 121, 122, 123, 124, 125, and 126 may include the first wiring layer 121 buried on the lower side of the first insulating layer 111, the second wiring layer 122 disposed on the upper surface of the first wiring layer 121 and buried below the second insulating layer 112, the third wiring layer 123 disposed on the upper surface of the second insulating layer 112 and buried below the third insulating layer 113, the fourth wiring layer 124 disposed on the upper surface of the third insulating layer 113 and buried below the fourth insulating layer 114, the fifth wiring layer 125 disposed on the upper surface of the fourth insulating layer 114 and buried below the fifth insulating layer 115, and the sixth wiring layer 126 disposed on the upper surface of the fifth insulating layer 115. The plurality of wiring layers 121, 122, 123, 124, 125, and 126 may include a smaller number of wiring layers or a larger number of wiring layers.

A metal material may be used as a material for the plurality of wiring layers 121, 122, 123, 124, 125, and 126, and as a metal material, copper (Cu), aluminum (Al), silver (Ag), tin (Sn), gold (Au), nickel (Ni), lead (Pb), titanium (Ti), or alloys thereof may be used. Each of the plurality of wiring layers 121, 122, 123, 124, 125, and 126 may perform various functions according to a design. For example, the plurality of wiring layers 121, 122, 123, 124, 125, and 126 may include a ground pattern, a power pattern, a signal pattern, and the like. Each of these patterns may have a shape of line, a shape of plane, or a pad shape. Also, the plurality of wiring layers 121, 122, 123, 124, 125, and 126 may be formed by a plating process such as AP, SAP, MSAP, TT, or the like, and may thus include a seed layer, an electroless plating layer, and an electroplating layer formed on the basis of the seed layer. The specific layer may further include copper foil.

The plurality of wiring via layers 131, 132, 133, 134, and 135 may include the first wiring via layer 131 penetrating the first insulating layer 111 and connecting the first and second wiring layers 121 and 122 to each other, a second wiring via layer 132 penetrating the second insulating layer 112 and connecting the second and third wiring layers 122 and 123 to each other, the third wiring via layer 133 penetrating the primer layer 140 and connecting the third and fourth wiring layers 123 and 124 to each other, the fourth wiring via layer 134 penetrating the fourth insulating layer 114 and connecting the fourth and fifth wiring layers 124 and 125 to each other, and the fifth wiring via layer 135 penetrating the fifth insulating layer 115 and connecting the fifth and sixth wiring layers 125 and 126 to each other. The plurality of wiring via layers 131, 132, 133, 134, and 135 may include a smaller number of wiring via layers, or may include a larger number of wiring via layers.

A metal material may be used as a material for the plurality of wiring via layers 131, 132, 133, 134, and 135, and as a metal material, copper (Cu), aluminum (Al), silver (Ag), tin (Sn), gold (Au), nickel (Ni), lead (Pb), titanium (Ti), or alloys thereof may be used. Each of the plurality of wiring via layers 131, 132, 133, 134, and 135 may include a signal connection via, a ground connection via, a power connection via, and the like according to a design. The wiring vias of the plurality of wiring via layers 131, 132, 133, 134, and 135 may be entirely filled with a metallic material, or a metal material may be formed along the wall surface of the via hole. Each of the plurality of wiring via layers 131, 132, 133, 134, and 135 may have a tapered shape tapered in the same direction. Also, the plurality of wiring via layers 131, 132, 133, 134, 135 may be formed by a plating process such as AP, SAP, MSAP, TT, or the like, and may thus include a seed layer, an electroless plating layer, and an electrolytic plating layer formed on the basis of the seed layer.

The passivation layer 150 may protect the lowermost first wiring layer 121 from external physical and chemical damage. The passivation layer 150 may be disposed on the lowermost first insulating layer 111 and may cover the lowermost first wiring layer 121. If necessary, an opening for exposing at least a portion of the first wiring layer 121 disposed on the lowermost side of the passivation layer 150 may be formed. An insulating material may be used as a material of the passivation layer 150. In this case, a thermosetting resin such as an epoxy resin, a thermoplastic resin such as polyimide, or a material in which these resins are mixed with an inorganic filler, such as ABF, for example, may be used, but an example embodiment thereof is not limited thereto.

As the descriptions of the other elements are the same as described above, detailed descriptions thereof will not be provided.

Figure 10:
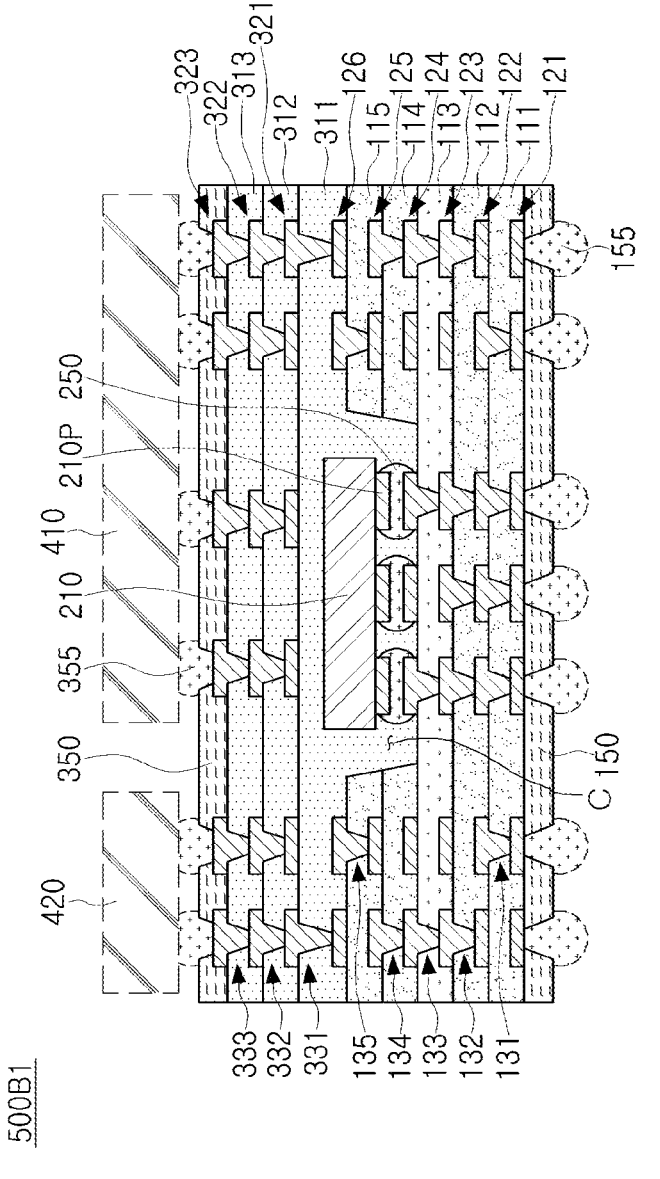
FIGS. 10 and 11 are cross-sectional diagrams illustrating an example and another example of a substrate including an electronic component embedded therein including the printed circuit board illustrated in FIG. 9, respectively.

FIG. 10 is a cross-sectional diagram illustrating another example of a substrate including an electronic component embedded therein including the printed circuit board illustrated in FIG. 9.

Referring to the drawings, a substrate including an electronic component embedded therein 500B1 in the example embodiment may include a core structure 10 having a cavity C, a first electronic component 210 disposed in the cavity C, and the built-up structure 20 disposed on the core structure 10 and the first electronic component 210. If necessary, the substrate 500B1 may further include at least one of a first passivation layer 150 disposed below the core structure 10, the second passivation layer 350 disposed above the built-up structure 20, a first electrical connection metal 155 disposed on the opening of the first passivation layer 150, a second electrical connection metal 355 disposed on the opening of the second passivation layer 350, and second and third electronic components 410 and 420 surface-mounted on the built-up structure 20 through the second electrical connection metal 355.

The core structure 10 may include a first insulating body including a plurality of core insulating layers 111, 112, 113, 114, and 115, a plurality of core wiring layers 121, 122, 123, 124, 125, and 126 disposed on or in the first insulating body, and a plurality of core wiring via layers 131, 132, 133, 134, 135, and 136 penetrating a portion of the first insulating body and connected to the plurality of core wiring layers 121, 122, 123, 124, 125, and 126. The cavity C of the core structure 10 may penetrate the fourth and fifth core insulating layers 114 and 115 disposed above the third core insulating layer 113. Accordingly, the third core insulating layer 113 may work as a barrier layer for a blasting process for forming the cavity C. In this case, the third core insulating layer 113 may have a modulus lower than those of the fourth and fifth core insulating layers 114 and 115 in which the cavity C is formed.

The first electronic component 210 may be disposed in the cavity C. The first electronic component 210 may be configured as an IC in which hundreds to millions of devices are integrated into a single chip. For example, the first electronic component 120 may be implemented by a processor chip such as a central processor (e.g., CPU), a graphics processor (e.g., GPU), a field programmable gate array (FPGA), a digital signal processor, an encryption processor, a microprocessor, a microcontroller, and may be implemented by, for example, an application processor (AP), but an example embodiment thereof is not limited thereto, and may be implemented by a memory such as a volatile memory (e.g., DRAM), a non-volatile memory (e.g., ROM), a flash memory, or the like, or an analog-to-digital converter, or a logic such as an application-specific IC (ASIC). The first electronic component 210 may be disposed to face down such that a connection pad 210P may be electrically connected to at least a portion 124b of the fourth core wiring layer 124 exposed through the cavity C through a connection member 250 such as a solder adhesive. The first electronic component 210 may be configured as a chip-type passive component, such as a chip-type inductor or a chip-type capacitor, for example. The first electronic component 210 may be a combination of an IC and a passive component in the form of a chip, and in this case, a plurality of cavities C may be formed.

The built-up structure 20 may include a second insulating body covering at least a portion of each of the core structure 10 and the first electronic component 210, filling at least a portion of the cavity C, and including one or more built-up insulating layers 311, 312, and 313, one or more built-up wiring layers 321, 322, and 323 disposed on or in the second insulating body, and one or more built-up wiring via layers 331, 332, and 333 each penetrating a portion of the second insulating body and connected to the one or more built-up wiring layers 321, 322, and 323.

The second insulating body may include the one or more built-up insulating layers 311, 312, and 313, and the number of the built-up insulating layers 311, 312, and 313 may be greater or smaller than the example in the diagram. An insulating material may be used as the material of the second insulating body, and as the insulating material, a thermosetting resin such as epoxy resin, a thermoplastic resin such as polyimide, or a material in which these resins are mixed with an inorganic filler, such as ABF, for example, may be used, but an example embodiment thereof is not limited thereto. If necessary, a material further including a reinforcing material such as glass fiber, such as PPG, for example, may be used.

The number of the one or more built-up wiring layers 321, 322, and 323 may be greater or smaller than the example in the diagram. A metal material may be used as a material for the one or more built-up wiring layers 321, 322, and 323, and as a metal material, copper (Cu), aluminum (Al), silver (Ag), tin (Sn), gold (Au), nickel (Ni), lead (Pb), titanium (Ti), or an alloy thereof may be used. Each of the one or more built-up wiring layers 321, 322, and 323 may perform various functions according to a design. For example, the one or more built-up wiring layers 321, 322, and 323 may include a ground pattern, a power pattern, a signal pattern, and the like. Each of these patterns may have a shape of line, a shape of plane, or a pad shape. The one or more built-up wiring layers 321, 322, and 323 may be formed by a plating process such as AP, SAP, MSAP, TT, or the like, and may thus include a seed layer, an electroless plating layer, and an electroplating layer formed based on the seed layer. The specific layer may further include copper foil.

The number of the one or more built-up wiring via layers 331, 332, and 333 may be greater or smaller than the example in the diagram, and a metal material may be used as a material for one or more built-up wiring via layers 331, 332, and 333, and as a metal material, copper (Cu), aluminum (Al), silver (Ag), tin (Sn), gold (Au), nickel (Ni), lead (Pb), titanium (Ti), or alloys thereof may be used. Each of the one or more built-up wiring via layers 331, 332, and 333 may include a signal connection via, a ground connection via, and a power connection via according to a design. Each of the wiring vias of the one or more built-up wiring via layers 331, 332, and 333 may be entirely filled with a metal material, or a metal material may be formed along the wall surface of the via hole. The one or more built-up wiring via layers 331, 332, and 333 may have a tapered shape. The one or more built-up wiring via layers 331, 332, 333 may be formed by a plating process, such as AP, SAP, MSAP, TT, or the like, for example, and may include a seed layer, an electroless plating layer, and an electrolytic plating layer formed on the basis of the seed layer.

Each of the first and second passivation layers 150 and 350 may protect the lowermost first core wiring layer 121 and the uppermost third built-up wiring layer 323 from external physical and chemical damage. The first and second passivation layers 150 and 350 may have openings for exposing at least a portion of the lowermost first core wiring layer 121 and at least a portion of the uppermost third built-up wiring layer 323. A plurality of the openings may be provided. An insulating material may be used for the material of the first and second passivation layers 150 and 350. In this case, a thermosetting resin such as an epoxy resin, a thermoplastic resin such as polyimide, or a mixture of these resins with an inorganic filler, such as ABF, may be used, but an example embodiment thereof is not limited thereto.

The first and second electrical connection metals 155 and 355 may be disposed on the openings of the first and second passivation layers 150 and 350, respectively. The first and second electrical connection metals 155 and 355 may be connected to at least an exposed portion of the lowermost first core wiring layer 121 and at least an exposed portion of the uppermost third built-up wiring layer 323. The first electrical connection metal 155 may physically and/or electrically connect the substrate 500B1 to an external entity. For example, the substrate 500B1 may be mounted on a main board of an electronic device or a BGA substrate through the element. The second electrical connection metal 355 may physically and/or electrically connect the substrate 500B1 to the second and third electronic components 410 and 420 surface-mounted thereon. The first and second electrical connection metals 155 and 355 may be formed of tin (Sn) or an alloy including tin (Sn), such as solder, but an example embodiment thereof is not limited thereto. Each of the first and second electrical connection metals 155 and 355 may be configured as a land, a ball, a pin, or the like.

The second and third electronic components 410 and 420 may be configured as surface mounted components. The second and third electronic components 410 and 420 may be an active component and/or a passive component, respectively. An example of the active component may include the IC described in relation to the first electronic component 120. An example of passive component may include a chip-type capacitor such as a multilayer ceramic capacitor (MLCC), and a chip-type inductor such as a power inductor (PI). If necessary, a molding material covering the second and third electronic components 410 and 420 may be further disposed on the second passivation layer 350, and the molding material may be a general EMC, but an example embodiment thereof is limited thereto. When the second and third electronic components 410 and 420 are further disposed, the electronic component embedded substrate 500B1 may be used as a system in package (SiP).

As the descriptions of the other elements are the same as described above, the detailed descriptions thereof will not be provided.

Figure 11:
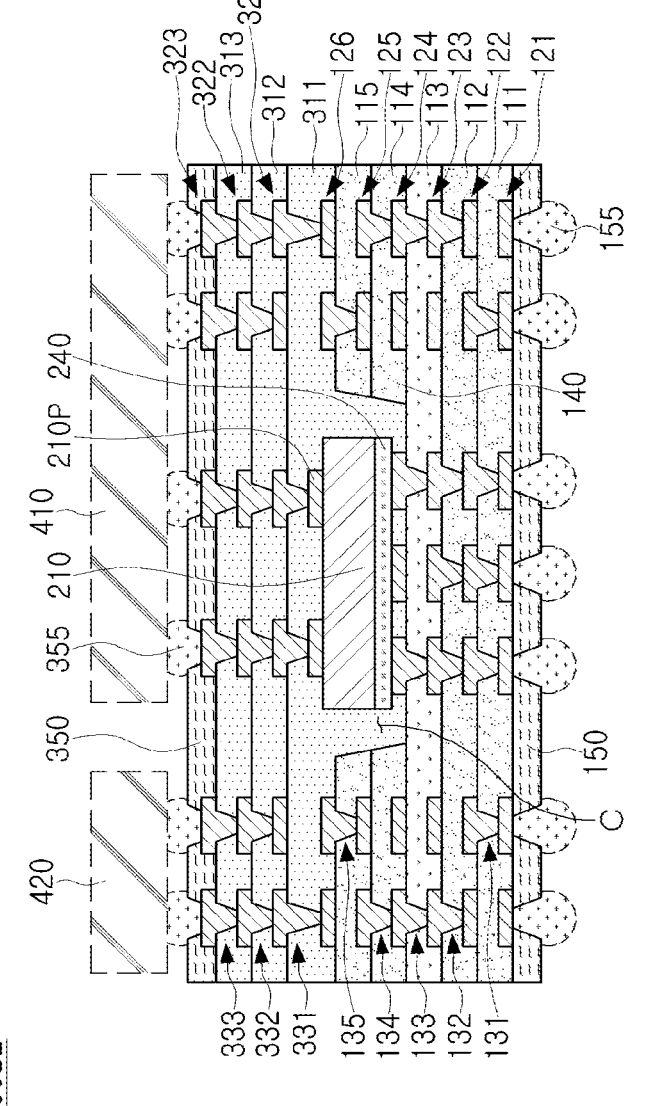

FIG. 11 is a cross-sectional diagram illustrating another example of a substrate including an electronic component embedded therein including the printed circuit board illustrated in FIG. 9.

Referring to the diagram, in the substrate including an electronic component embedded therein 500B2 in the example embodiment, the first electronic component 210 may be disposed to be faced up in the cavity as compared to the substrate including an electronic component embedded therein 500B1 described in the aforementioned example embodiment. The first electronic component 210 may be attached to the bottom surface of the cavity C through an adhesive member 240 such as DAF. The connection pad 210P of the first electronic component 210 may be electrically connected to at least a portion of the first built-up wiring layer 321 through at least a portion of the first built-up wiring via layer 331. At least a portion of the first to fourth core wiring layers 121, 122, 123, and 124 and at least a portion of the first to third core wiring via layers 131, 132, and 133 may be disposed below the first electronic component 210, and may be used as a heat dissipation path for emitting heat received from a back surface of the first electronic component 210.

As the descriptions of the other elements are the same as described above, the detailed descriptions thereof will not be provided.

Figure 12:
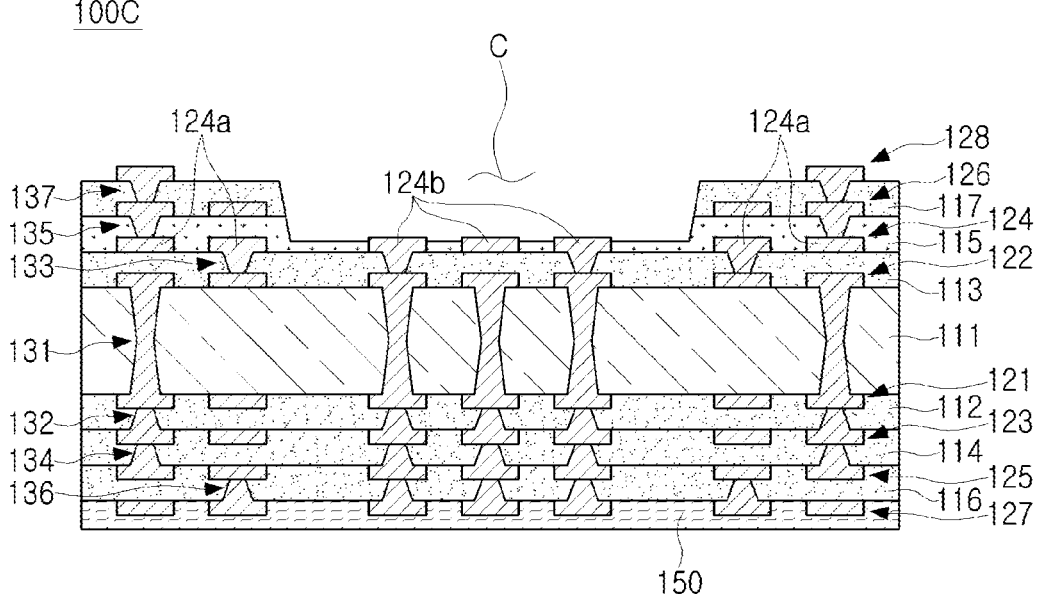
FIG. 12 is a cross-sectional diagram illustrating another example of a printed circuit board.

FIG. 12 is a cross-sectional diagram illustrating another example of a printed circuit board.

Figure 13:
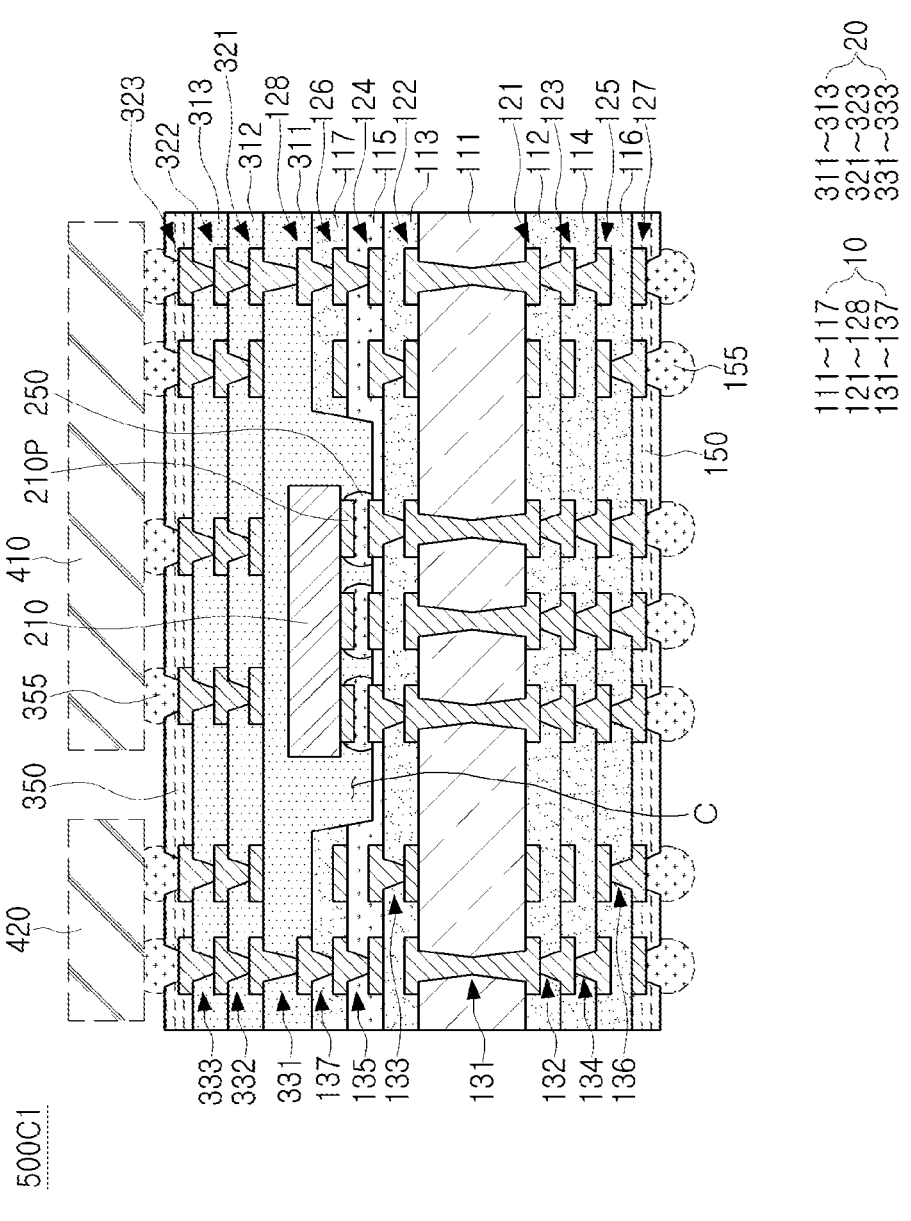
FIGS. 13 and 14 are cross-sectional diagrams illustrating an example and another example of a substrate including an electronic component embedded therein including the printed circuit board illustrated in FIG. 12, respectively.
Figure 14:
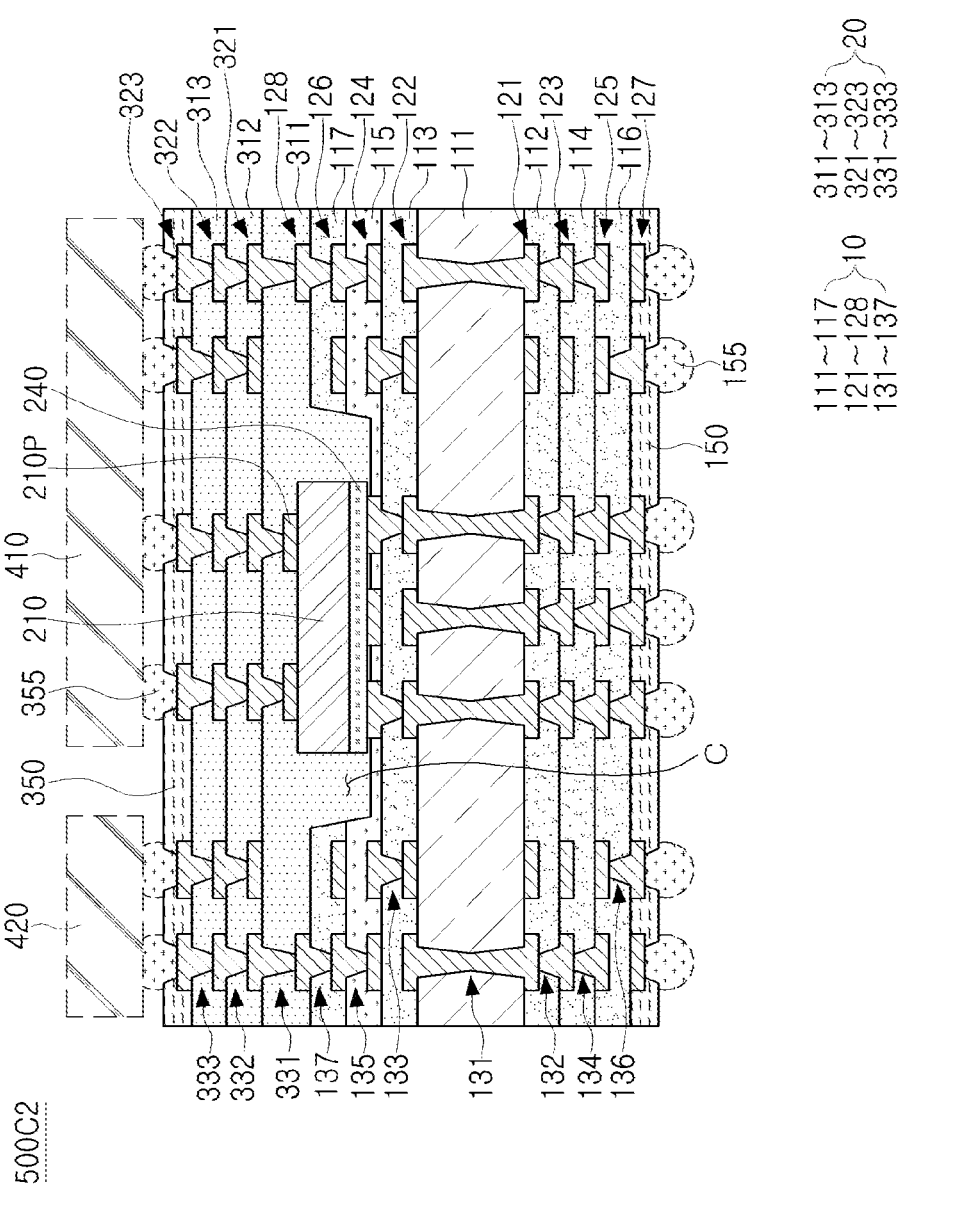

FIGS. 13 and 14 are cross-sectional diagrams illustrating an example and another example of a substrate including an electronic component embedded therein including the printed circuit board illustrated in FIG. 12, respectively.

Referring to the diagrams, in a printed circuit board 100C and substrates including an electronic component embedded therein 500C1 and 500C2 including the same in the example embodiment, the fifth insulating layer 115, rather than the third insulating layer 113, may work as a barrier layer, as compared to the printed circuit board 100A and the substrates including an electronic component embedded therein 500A1 and 500A2 including the same. In this case, the fifth insulating layer 115 may have a smaller modulus than that of the seventh insulating layer 117 in which the cavity C is formed. The cavity C may further penetrate a portion of the fifth insulating layer 115 such that the upper surface of the fifth insulating layer 115 may have a difference, and the cavity C may expose at least a portion of the upper surface of the fifth insulating layer 115. Accordingly, the upper surface of the fifth insulating layer 115 in the region covered by the seventh insulating layer 117 and the upper surface of the fifth insulating layer 115 in the region exposed from the cavity C may have a difference therebetween. The fourth wiring layer 124 may include first and second wiring patterns 124a and 124b which may be disposed on the upper surface of the third insulating layer 113 and each may have at least portion buried in the fifth insulating layer 115. The upper surface of the first wiring pattern 124a may be covered by the fifth insulating layer 115, whereas the upper surface of the second wiring pattern 124b may be exposed by the cavity C. The upper surface of the second wiring pattern 124b exposed by the cavity C may have a difference from the upper surface of the fifth insulating layer 115 provided as the bottom surface of the cavity C.

As the descriptions of the other elements are the same as described above, the detailed descriptions thereof will not be provided.

Figure 15:
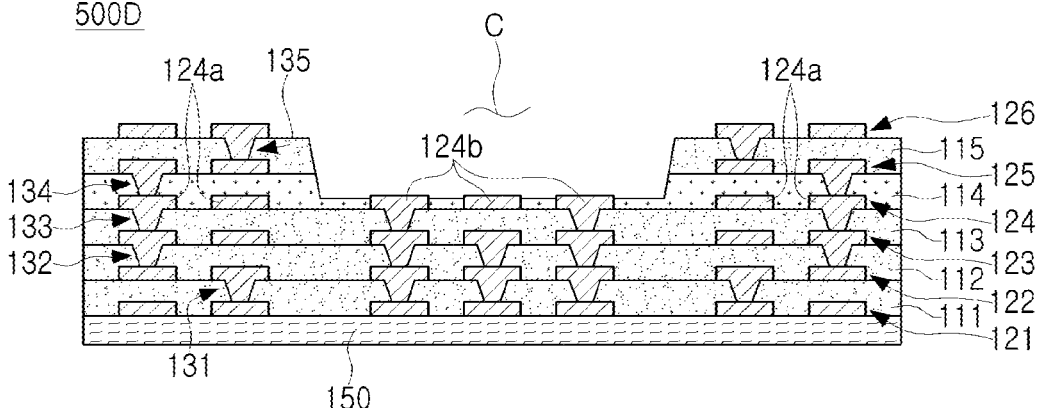
FIG. 15 is a cross-sectional diagram illustrating another example of a printed circuit board.

FIG. 15 is a cross-sectional diagram illustrating another example of a printed circuit board.

Figure 16:
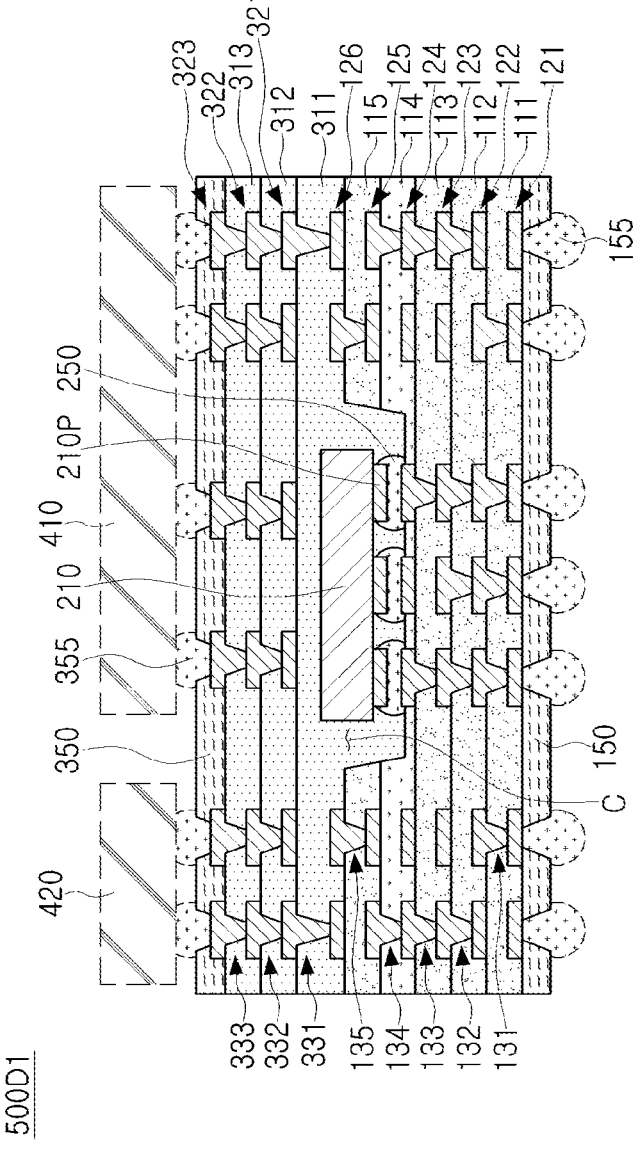
FIGS. 16 and 17 are cross-sectional diagrams illustrating an example and another example of a substrate including an electronic component embedded therein including the printed circuit board illustrated in FIG. 15, respectively.
Figure 17:
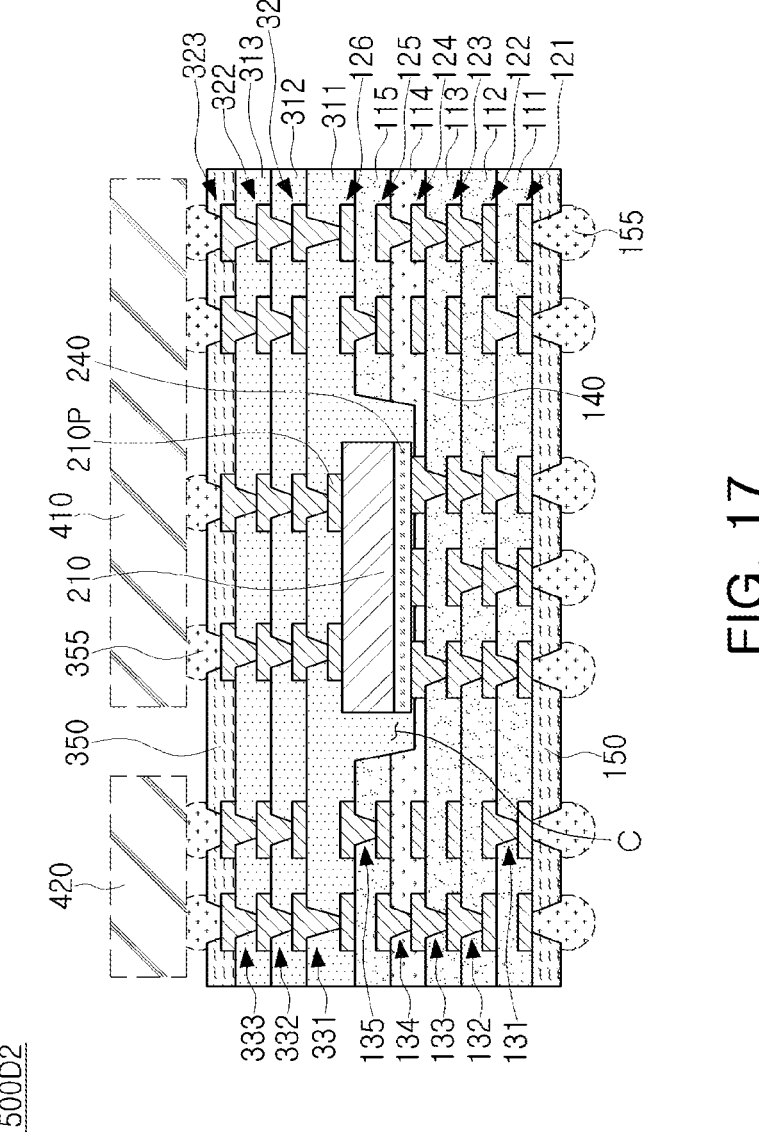

FIGS. 16 and 17 are cross-sectional diagrams illustrating an example and another example of a substrate including an electronic component embedded therein including the printed circuit board illustrated in FIG. 15, respectively.

Referring to the diagrams, in a printed circuit board 100D and substrates including an electronic component embedded therein 500D1 and 500D2 including the same in the example embodiment, the fourth insulating layer 114, rather than the third insulating layer 113, may work as a barrier layer, as compared to the printed circuit board 100B and the substrates including an electronic component embedded therein 500B1 and 500B2 described in the aforementioned example embodiment. In this case, the fourth insulating layer 114 may have a modulus lower than that of the fifth insulating layer 115 in which the cavity C is formed. The cavity C may further penetrate a portion of the fourth insulating layer 114 such that the upper surface of the fourth insulating layer 114 may have a difference, and the cavity C may expose at least a portion of the upper surface of the fourth insulating layer 114. Accordingly, the upper surface of the fourth insulating layer 114 in the region covered with the fifth insulating layer 115 and the upper surface of the fourth insulating layer 114 in the region exposed from the cavity C may have a difference therebetween. The fourth wiring layer 124 may be disposed on the upper surface of the third insulating layer 113 and may include first and second wiring patterns 124a and 124b each having at least a portion buried in the fourth insulating layer 114. The upper surface of the first wiring pattern 124a may be covered by the fourth insulating layer 114, whereas the upper surface of the second wiring pattern 124b may be exposed by the cavity C. The upper surface of the second wiring pattern 124b exposed by the cavity C may have a difference from the upper surface of the fourth insulating layer 114 provided as the bottom surface of the cavity C.

As the descriptions of the other elements are the same as described above, the detailed descriptions thereof will not be provided.

Figure 18:
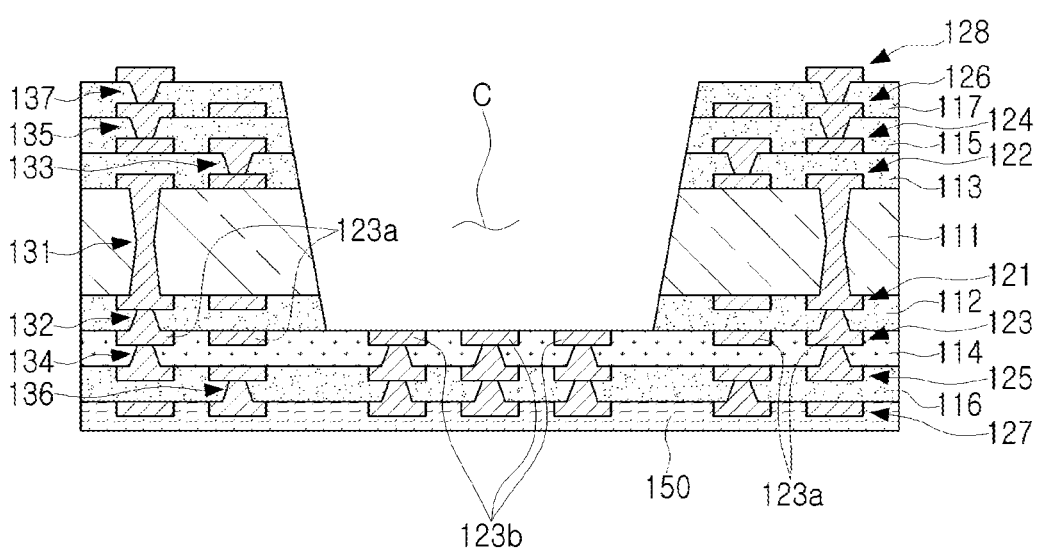
FIG. 18 is a cross-sectional diagram illustrating another example of a printed circuit board.

FIG. 18 is a cross-sectional diagram illustrating another example of a printed circuit board.

Figure 19:
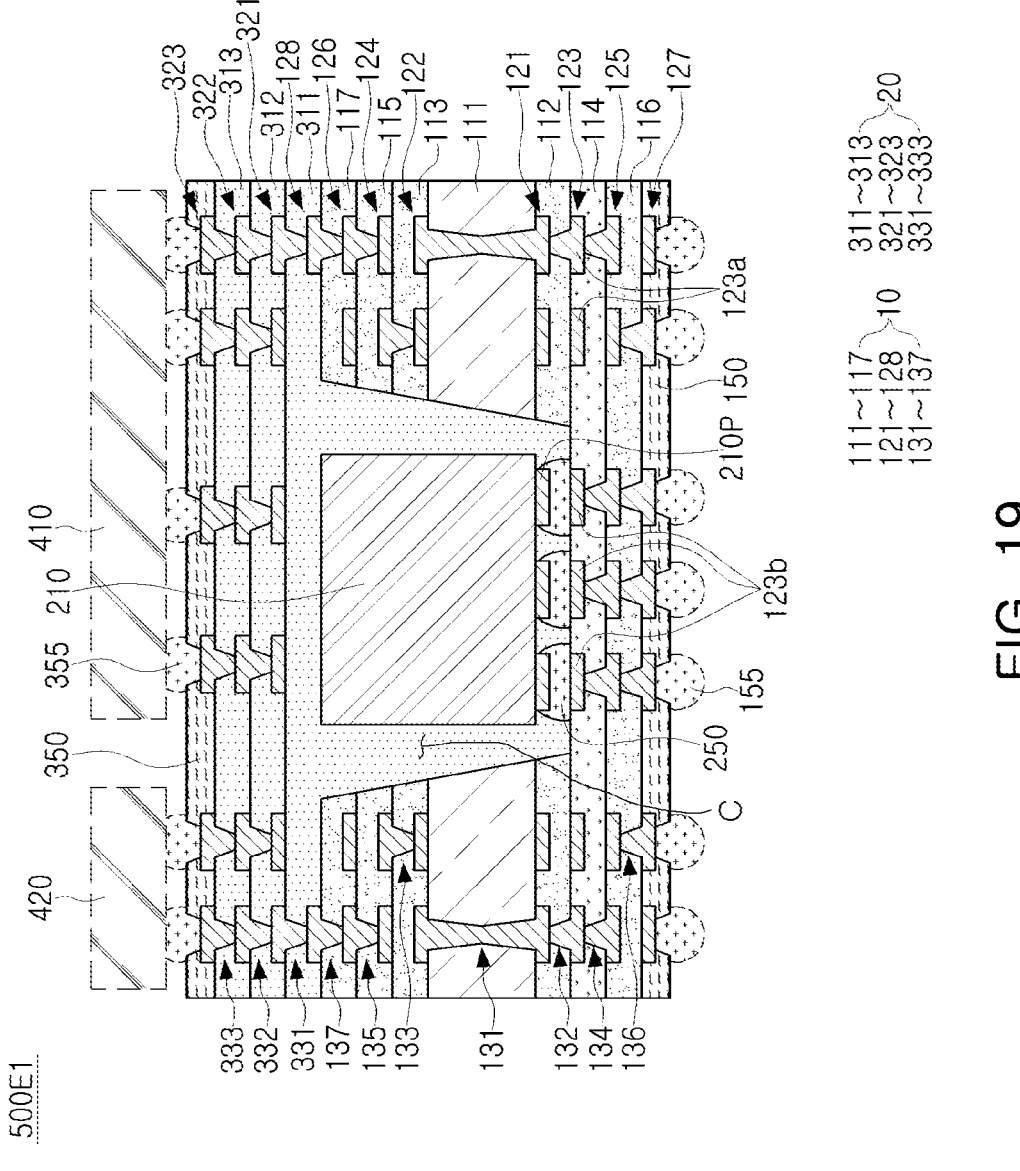
FIGS. 19 and 20 are cross-sectional diagrams illustrating an example and another example of a substrate including an electronic component embedded therein including the printed circuit board illustrated in FIG. 18, respectively.
Figure 20:
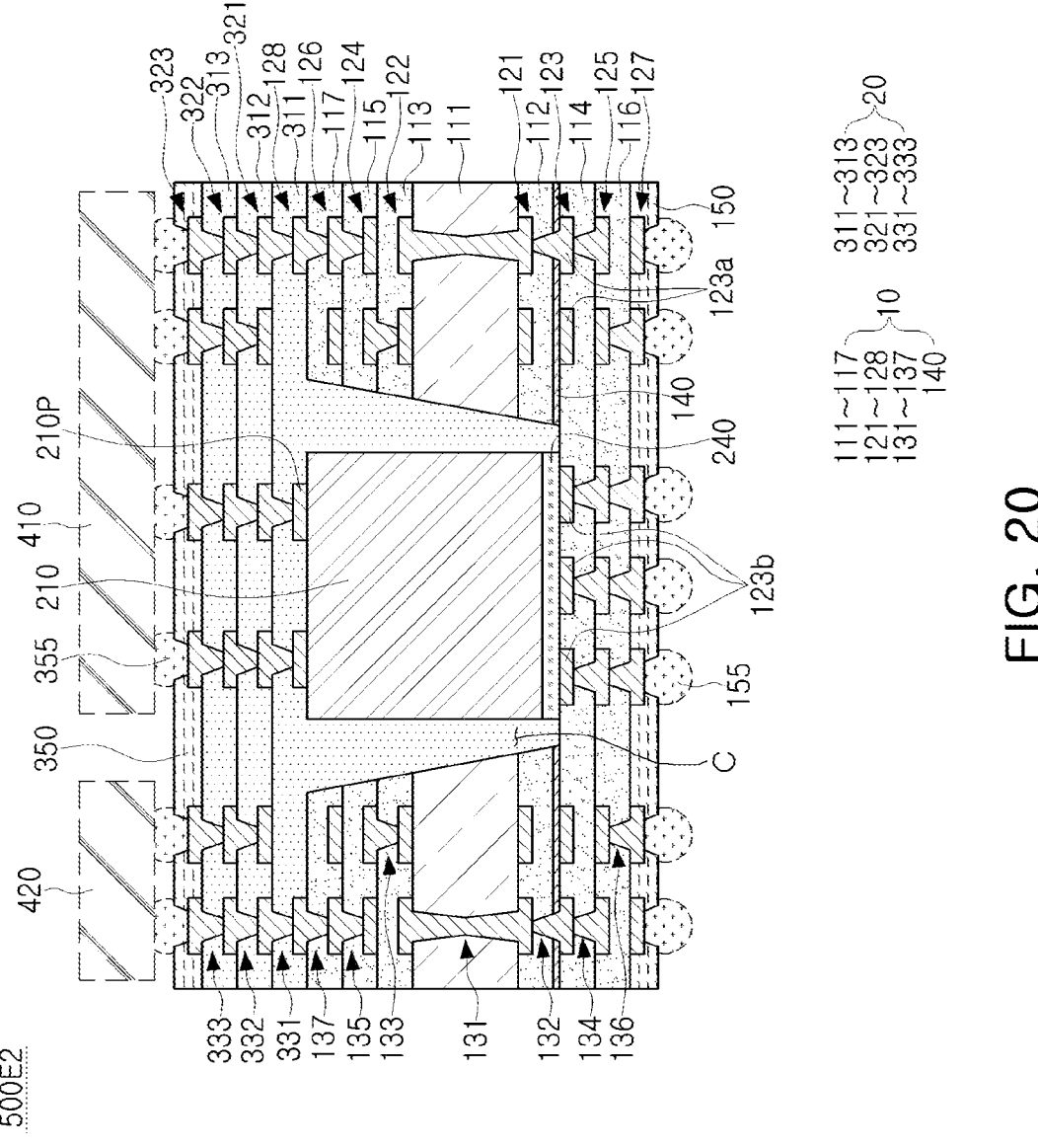

FIGS. 19 and 20 are cross-sectional diagrams illustrating an example and another example of a substrate including an electronic component embedded therein including the printed circuit board illustrated in FIG. 18, respectively.

Referring to the drawings, in a printed circuit board 100E and substrates including an electronic component embedded therein 500E1 and 500E2 including the same in the example embodiment, the fourth insulating layer 114 instead of the third insulating layer 113 may work as a barrier layer as compared to the printed circuit board 100A and the substrates including an electronic component embedded therein 500A1 and 500A2 including the same described in the aforementioned example embodiment. In this case, the fourth insulating layer 114 may have a modulus lower than those of the first, second, third, fifth, and seventh insulating layers 111, 112, 113, 115 and 117 in which the cavity C is formed. The cavity C may expose at least a portion of the upper surface of the fourth insulating layer 114. The third wiring layer 123 may include a first wiring pattern 123a having at least a portion buried in the fourth insulating layer 114 and buried in the fourth insulating layer 114 such that at least a portion of the upper surface thereof may be covered by the second insulating layer 112, and a second wiring pattern buried in the fourth insulating layer 114 such that at least a portion of the upper surface thereof may be exposed by the cavity C. At least a portion of the third wiring layer 123 may be buried in the second insulating layer 112 through the second wiring via layer 132 penetrating the second insulating layer 112 such that the upper surface thereof may be connected to at least a portion of the first wiring layer 121 exposed from the upper surface.

As the descriptions of the other elements are the same as described above, the detailed descriptions thereof will not be provided.

Figure 21:
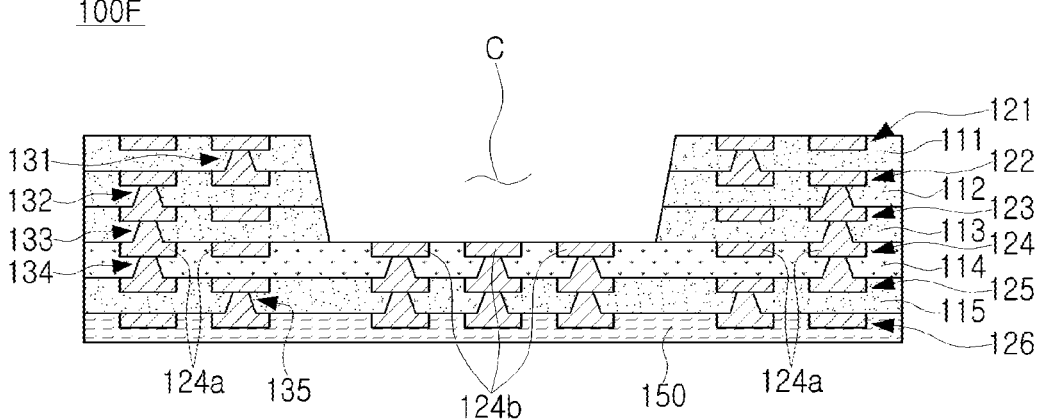
FIG. 21 is a cross-sectional diagram illustrating another example of a printed circuit board.

FIG. 21 is a cross-sectional diagram illustrating another example of a printed circuit board.

Figure 22:
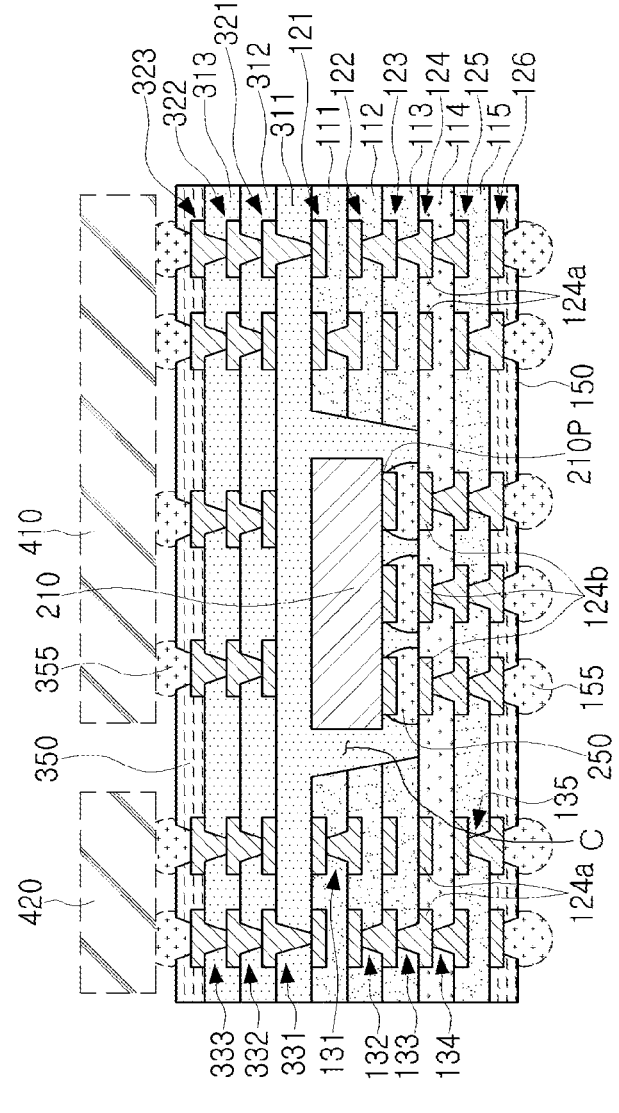
FIGS. 22 and 23 are cross-sectional diagrams illustrating an example and another example of a substrate including an electronic component embedded therein including the printed circuit board illustrated in FIG. 21, respectively.
Figure 23:
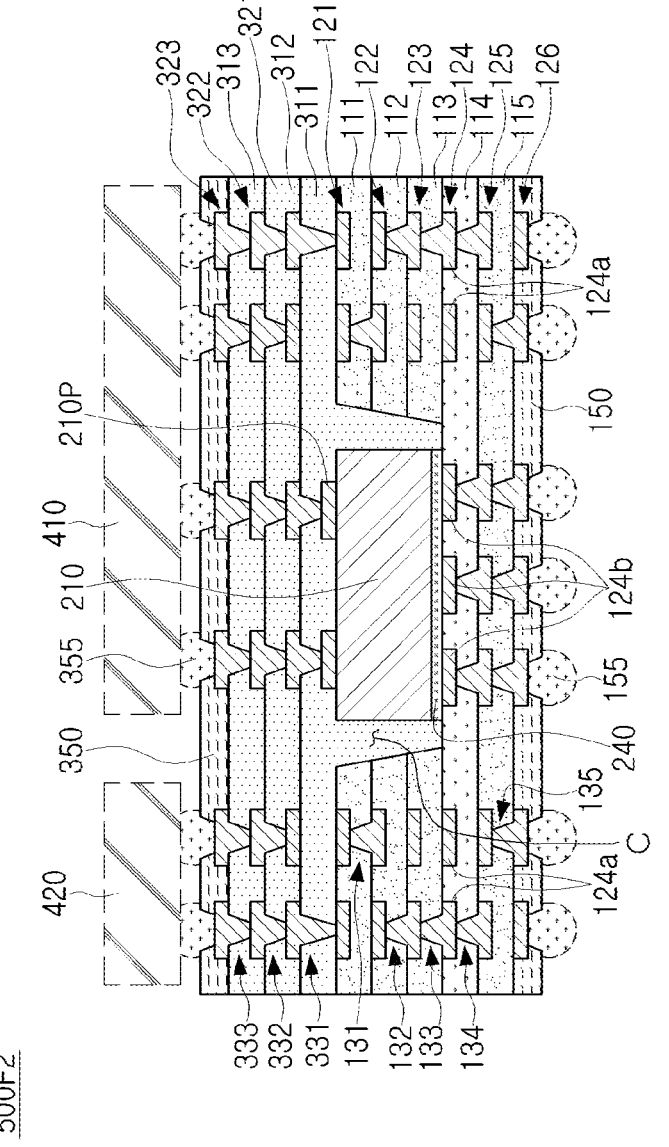

FIGS. 22 and 23 are cross-sectional diagrams illustrating an example and another example of a substrate including an electronic component embedded therein including the printed circuit board illustrated in FIG. 21, respectively.

Referring to the drawings, in a printed circuit board 100F and substrates including an electronic component embedded therein 500F1 and 500F2 including the same, the fourth insulating layer 114 instead of the third insulating layer 113 may work as a barrier layer and may be disposed upside down, as compared to the printed circuit board 100B and the substrates including an electronic component embedded therein 500B1 and 500B2 including the same described in the aforementioned example embodiment. In this case, the fourth insulating layer 114 may have a modulus lower than those of the insulating layers 111, 112, and 113 in which the cavity C is formed. The cavity C may expose at least a portion of the upper surface of the fourth insulating layer 114. The fourth wiring layer 124 may include a first wiring pattern 124a having at least a portion buried in the fourth insulating layer 114, and buried in the fourth insulating layer 114 such that at least a portion of the upper surface thereof may be covered by the third insulating layer 113, and a second wiring pattern 124b buried in the fourth insulating layer 114 such that at least a portion of the upper surface thereof may be exposed by the cavity C. At least a portion of the fourth wiring layer 124 may be buried in the third insulating layer 113 through the third wiring via layer 133 penetrating the third insulating layer 113, such that the upper surface thereof may be connected to at least a portion of the third wiring layer 123 exposed from the upper surface.

As the descriptions of the other elements are the same as described above, the detailed descriptions thereof will not be provided.

According to the aforementioned example embodiments, a printed circuit board which may implement a cavity by a blasting process without a stopper, and a substrate including an electronic component embedded therein including the same may be provided.

In the example embodiments, the terms "side portion," "side surface," and the like, may be used to refer to a surface formed taken in right/left directions with reference to a cross-section in the diagrams for ease of description, the terms "upper side," "upper portion," "upper surfaces," and the like, may be used to refer to a surface formed in an upward direction with reference to a cross-section in the diagrams for ease of description, and the terms "lower side," "lower portion," "lower surface," and the like, may be used to refer to a surface formed in a downward direction. The notion that an element is disposed on a side region, an upper side, an upper region, or a lower resin may include the configuration in which the element is directly in contact with an element configured as a reference in respective directions, and the configuration in which the element is not directly in contact with the reference element. The terms, however, may be defined as above for ease of description, and the scope of right of the example embodiments is not limited to the above terms.

In the example embodiments, the term "connected" may not only refer to "directly connected" but also include "indirectly connected" by means of an adhesive layer, or the like. Also, the term "electrically connected" may include both of the case in which elements are "physically connected" and the case in which elements are "not physically connected." Further, the terms "first," "second," and the like may be used to distinguish one element from the other, and may not limit a sequence and/or an importance, or others, in relation to the elements. In some cases, a first element may be referred to as a second element, and similarly, a second element may be referred to as a first element without departing from the scope of rights of the example embodiments.

In the example embodiments, the term "example embodiment" may not refer to one same example embodiment, but may be provided to describe and emphasize different unique features of each example embodiment. The above suggested example embodiments may be implemented do not exclude the possibilities of combination with features of other example embodiments. For example, even though the features described in one example embodiment are not described in the other example embodiment, the description may be understood as relevant to the other example embodiment unless otherwise indicated.

While the example embodiments have been shown and described above, it will be apparent to those skilled in the art that modifications and variations could be made without departing from the scope of the present invention as defined by the appended claims.

What is claimed is:

1. A printed circuit board, comprising:
a first insulating layer having a first modulus;
a first wiring layer;
a second insulating layer disposed on the first insulating layer and having a second modulus, the second insulating layer comprising a third insulating layer contacting the first insulating layer and a fourth insulating layer disposed on the third insulating layer; and
a cavity penetrating the second insulating layer,
wherein the first wiring layer includes a first wiring pattern of which at least a portion of one surface exposed from one surface of the first insulating layer is covered by and in contact with the second insulating layer, and a second wiring pattern of which at least a portion of one surface exposed from one surface of the first insulating layer is exposed by the cavity,
wherein the first wiring pattern includes a first conducting via penetrating the third insulating layer and connecting the first wiring pattern to a third wiring layer disposed on or in the third insulating layer, the fourth insulating layer covering at least a portion of a surface of the third wiring layer exposed through the third insulating layer, wherein the second modulus is greater than the first modulus, wherein an upper surface portion of the first insulating layer forms a bottom surface of the cavity, and is not covered by the second insulating layer in a thickness direction, wherein an interface between the first and second insulating layers is coplanar with or lower than an upper surface of the second wiring pattern when viewed in a cross-section view, and wherein the second wiring pattern is connected to a conductive via penetrating at least a portion of the first insulating layer.

2. The printed circuit board of claim 1, wherein the second modulus is four times the first modulus or greater.

3. The printed circuit board of claim 2, wherein the first insulating layer includes liquid crystal polymer, and wherein the second insulating layer includes prepreg.

4. The printed circuit board of claim 1, wherein the cavity exposes at least a portion of one surface of the first insulating layer, and wherein exposed one surface of the first insulating layer is provided as a bottom surface of the cavity.

5. The printed circuit board of claim 1, further comprising:

a third wiring layer buried in the fourth insulating layer and having one surface exposed from one surface of the fourth insulating layer; and a wiring via layer penetrating the fourth insulating layer and connecting at least a portion of the second wiring layer to at least a portion of the third wiring layer.

6. The printed circuit board of claim 1, wherein the first wiring layer is buried in the first insulating layer and exposed from one surface of the first insulating layer.

7. The printed circuit board of claim 1, wherein an edge portion of a bottom surface of the cavity is formed of an insulating material.

8. A printed circuit board, comprising:

a first insulating body including a first insulating layer having a first etch rate for microblasting and a first wiring layer;

a second insulating layer having a second etch rate for microblasting, the second etch rate being greater than the first etch rate, the second insulating layer comprising a third insulating layer contacting the first insulating layer and a fourth insulating layer disposed on the third insulating layer; and a cavity penetrating the second insulating layer and exposing a surface of the first insulating layer;

wherein the first wiring layer includes a first wiring pattern of which at least a portion of one surface exposed from one surface of the first insulating layer is covered by and in contact with the second insulating layer, and a second wiring pattern of which at least a portion of one surface exposed from one surface of the first insulating layer is exposed by the cavity, wherein the first wiring pattern includes a first conducting via penetrating the third insulating layer and connecting the first wiring pattern to a third wiring layer disposed on or in the third insulating layer, the fourth insulating layer covering at least a portion of a surface of the third wiring layer exposed through the third insulating layer, and wherein an upper surface portion of the first insulating layer forms a bottom surface of the cavity, and is not covered by the second insulating layer in a thickness direction.

9. The printed circuit board of claim 8, further comprising an electronic component disposed in the cavity such that at least a portion of the bottom of the cavity is exposed; and a first wiring layer disposed in or on the first insulating layer, the first wiring layer being connected to the electronic component.

10. The printed circuit board of claim 9, further comprising a second insulating body disposed on the second insulating layer, covering at least a portion of the second insulating layer and at least a portion of the electronic component, and filling at least a portion of the cavity.

11. The printed circuit board of claim 8, wherein the second etch rate is at least ten times greater than the first etch rate.

12. The printed circuit board of claim 8, further comprising a second insulating body disposed on the second insulating layer; and a second wiring layer disposed on or in the second insulating layer, the second wiring layer being connected to the first wiring layer.

13. The printed circuit board of claim 8, wherein the first wiring layer is buried in the first insulating layer and exposed from one surface of the first insulating layer.

* * * * *